US006415104B1

(12) United States Patent
Fitts et al.

(10) Patent No.: US 6,415,104 B1
(45) Date of Patent: Jul. 2, 2002

(54) HEATING ELEMENTS COMPRISING POLYBUTADIENE AND POLYISOPRENE BASED THERMOSETTING COMPOSITIONS

(75) Inventors: Bruce B. Fitts, Danielson; Elana E. Haveles, Manchester; David E. Manso, Thompson; Vincent R. Landi, Danielson, all of CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 09/539,971

(22) Filed: Mar. 31, 2000

Related U.S. Application Data

(63) Continuation-in-part of application No. 08/238,178, filed on May 4, 1994, which is a continuation-in-part of application No. 08/052,138, filed on Apr. 23, 1993, now abandoned, which is a continuation of application No. 07/349,595, filed on May 9, 1989, now Pat. No. 5,223,568, which is a continuation-in-part of application No. 07/050,243, filed on May 14, 1987, now abandoned.

(51) Int. Cl.$^7$ .................................................. H05B 3/40
(52) U.S. Cl. ........................ 392/503; 219/544; 252/500
(58) Field of Search .................... 332/503, 432, 332/434; 29/611; 219/544–549; 252/500

(56) References Cited

U.S. PATENT DOCUMENTS

| | | | |
|---|---|---|---|
| 3,642,687 A | 2/1972 | Naarmann et al. | 525/237 |
| 3,644,584 A | 2/1972 | Fryd | |
| 3,860,672 A | 1/1975 | Legally | |
| 3,919,133 A | 11/1975 | Dawans et al. | 525/237 |
| 3,943,328 A | 3/1976 | Cunningham | |
| 4,017,436 A | 4/1977 | Tabana | |
| 4,113,800 A | 9/1978 | Lee, Jr. | |
| 4,197,377 A | 4/1980 | Bohm | |
| 4,229,550 A | 10/1980 | Jones | |
| 4,241,132 A | 12/1980 | Pratt et al. | |
| 4,267,080 A | 5/1981 | Yokoyama et al. | |

(List continued on next page.)

FOREIGN PATENT DOCUMENTS

| | | |
|---|---|---|
| CH | 26 48 595 | 5/1977 |
| DE | 25 39 412 | 3/1976 |
| EP | 0 202 488 | 11/1986 |
| EP | 0 220 160 | 4/1987 |
| EP | 0 234 450 | 9/1987 |
| EP | 0 389 076 | 9/1990 |
| EP | 0 430 092 A3 | 6/1991 |

(List continued on next page.)

OTHER PUBLICATIONS

"High Vinyl 1–2 Liquid Polybutadiene–Ricon Molding Compound CCS–110" Feb. 1, 1980 pub. Colorado Chemical Spec.
Takeuchi et al., "Thermoplastic 1,2—polybutadiene," in New Industrial Polymers. ACS #4, pp. 15–25.

(List continued on next page.)

*Primary Examiner*—Philip H. Leung
*Assistant Examiner*—Thor Campbell
(74) *Attorney, Agent, or Firm*—Cantor Colburn LLP

(57) ABSTRACT

Articles are formed from a thermosetting composition based on polybutadiene or polyisoprene resins which are subjected to a high temperature cure step of greater than 250° C. The thermosetting compositions may include fillers such as particulate ceramic fillers and may also include woven webs for improved dimensional stability and decreased brittleness. The formation process of this invention is particularly well suited for making electrical circuit substrates for microwave and digital circuits, typically in the form of the thermosetting composition being laminated on one or both opposed surfaces to metal conductive foil (e.g., copper). The compositions find particular utility for encapsulating and electrically insulating electrical resistance heating elements for use with fluids.

77 Claims, 6 Drawing Sheets

U.S. PATENT DOCUMENTS

| | | | |
|---|---|---|---|
| 4,268,433 A | 5/1981 | Sawatari | |
| 4,370,448 A | 1/1983 | Leland | |
| 4,384,066 A | 5/1983 | O'Shea | |
| 4,499,240 A | 2/1985 | Valentine | |
| 4,554,470 A | 11/1985 | Jerson et al. | 524/449 |
| 4,578,420 A | 3/1986 | Handl | |
| 4,587,300 A | 5/1986 | Valentinue | |
| 4,600,745 A | 7/1986 | Creighton | 525/236 |
| 4,704,318 A | 11/1987 | Saito et al. | |
| 4,789,708 A | 12/1988 | Guzy | 525/237 |
| 4,820,764 A | 4/1989 | Guzy et al. | 524/526 |
| 4,997,702 A | 3/1991 | Gazit et al. | |
| 5,223,568 A | 6/1993 | Landi et al. | 524/526 |
| 5,264,065 A | 11/1993 | Kohm | |
| 5,586,214 A | 12/1996 | Eckman | |
| 5,930,459 A | 7/1999 | Eckman et al. | |

FOREIGN PATENT DOCUMENTS

| | | |
|---|---|---|
| EP | 0 460 539 A2 | 12/1991 |
| EP | 0 707 038 A1 | 9/1995 |
| GB | 2 061 989 A | 5/1981 |
| GB | 2 172 892 A | 10/1986 |
| JP | 5375250 | 4/1978 |
| JP | 6178871 | 4/1986 |
| JP | Hei 4-258658 | 9/1992 |

OTHER PUBLICATIONS

Bruzzone et al., LaChimica E L'Industria 47 (12) 1298–1302 (1965).
Shell Product Information re: Kraton Products.
Nippon Soda Borchure—"Nisso—PB".
McCreedy et al., Polymer 20 (4) (1979).
Chen, Tenth Electrical Insulation Conf., pp. 318–320 (1978).
Colorado Chemical Brochure—"Ricon Molding Compound" —Feb. 1, 1980.
Colorado Chemical Brochure—"Ricon Product Bulletin" —Aug. 20, 1985.
Colorado Chemical Brochure—"Ricon Radome".
Colorado Chemical Brochure—"Ricon Electrical Electronic".
Colorado Chemical Brochure—"Ricon Laminating Resins".
Barth et al., Modern Plastics, pp. 142–148, (Nov. 1970).
Bruzzone et al., LaChimica E. L'Industria 47 (12) 1298–1302 (1965) "High–Temperature Thermal Cross–linking of Cistatic Polybutadiene".
N. Sawatari, I. Watanabe, H. Okuyama and K. Murakawa, "A New Flame Retardant, 1,2–Polybutadiene Lamainate", 1983 pp. 131–137.
C.F. Chen, "Dielectric Properties of Polybutadiene and its Reinforced Composites at Room and Elevated Temperature" pp. 318–320.
Ronald E. Drake, "1,2–Polybutadienes–High Performance Resins for The Electrical Industry", pp. 730–733.

HEATING ELEMENTS COMPRISING POLYBUTADIENE AND POLYISOPRENE BASED THERMOSETTING COMPOSITIONS

CROSS-REFERENCE TO RELATED APPLICATION

This application is a continuation-in-part of U.S. application Ser. No. 08/238,178, filed May 5, 1994, which is a continuation-in-part of U.S. application Ser. No. 08/052,138 filed Apr. 23, 1993 now abandoned, which is a continuation of U.S. application Ser. No. 07/349,595 filed May 9, 1989 (now U.S. Pat. No. 5,223,568), which is a continuation-in-part of U.S. application Ser. No. 07/050,243 filed May 14, 1987 (now abandoned), all of which are incorporated by reference herein.

BACKGROUND OF THE INVENTION

This invention relates generally to a method of making thermosetting composites and the resulting products, which preferably comprise electrical circuit laminate materials and coatings for heating elements. More particularly, this invention relates to an electrical circuit laminate or a coating for a heating element comprising a thermosetting resin of polybutadiene or polyisoprene that is subjected to a high temperature cure at a temperature of greater than about 250° C., and which may optionally include (1) a polymer that crosslinks with the polybutadiene or polyisoprene resin; (2) a woven fibrous web impregnated with the resin; (3) discontinuous fibers dispersed within the resin system; and (4) optional inorganic particulate filler such as silica, titania and the like.

Commonly assigned U.S. Pat. No. 5,223,568 (which is fully incorporated herein by reference) describes a thermosetting composition which is particularly useful for making electrical substrate materials. In general, U.S. Pat. No. 5,223,568 describes a composition formed from the steps of:

(a) providing a moldable thermosetting composition that includes 1) polybutadiene or polyisoprene resin that is a liquid at room temperature and that has a molecular weight less than 5,000 and 2) a solid butadiene or isoprene-containing polymer capable of cross-linking with the polybutadiene or polyisoprene resin;

(b) forming the composition into a shape; and (c) curing the composition to produce the electrical substrate material, including subjecting the composition to a high temperature cure condition at a temperature greater than about 250° C. and less than the decomposition temperature of the composition. This composition thus comprises a two component system: the first component is the polybutadiene or polyisoprene resin, and the second component is the solid butadiene or isoprene-containing polymer. All of the components are subjected to the high temperature curing cycle (e.g., greater than 250° C.). In preferred embodiments, the solid polymer is a thermoplastic elastomer block copolymer.

U.S. Pat. No. 5,223,568 also describes a composition with a dielectric filler (i.e., a material having a dielectric constant greater than about 1.2 at microwave frequencies) homogeneously dispersed throughout the composition to the extent that, when the composition is cured, the properties of the cured article (e.g., dielectric constant and coefficient of thermal expansion) do not vary more than about 5% throughout the article.

In preferred embodiments, the composition of U.S. Pat. No. 5,223,568 further includes a crosslinking agent capable of co-curing (i.e., forming covalent bonds) with the polybutadiene or polyisoprene resin, the solid copolymer, or both. Examples of preferred crosslinking agents include triallylcyanurate, diallylphthalate, divinyl benzene, a multifunctional acrylate, or combinations of these agents. When the electrical substrate material includes a dielectric filler, the volume % of the filler (based upon the combined volume of resin, thermoplastic elastomer, crosslinking agent (if any) and filler) is between 5% and 80%, inclusive. Examples of preferred fillers include titanium dioxide (rutile and anatase), barium titanate, strontium titanate, silica (particles and hollow spheres), corundum, wollastonite, polytetrafluoroethylene, aramide fibers (e.g., Kevlar), fiberglass, $Ba_2Ti_9O_{20}$, glass spheres, quartz, boron nitride, aluminum nitride, silicon carbide, beryllia, and magnesia. They may be used alone or in combination.

The method disclosed in U.S. Pat. No. 5,223,568 provides a wide variety of shaped articles having favorable isotropic thermal and dielectric properties. These properties can be tailored to match or complement those of ceramic materials, including gallium arsenide, alumina, and silica. Thus, the cured articles can replace ceramic materials in many electronic and microwave applications: e.g., as specialized substrates for high speed digital and microwave circuits. Examples of microwave circuits include microstrip circuits, microstrip antennas, and stripline circuits. The cured products are also useful as rod antennas and chip carriers.

Polymeric coatings have also been used to cover electrical resistance heating elements. Electrical resistance heating elements used in connection with water heaters have traditionally been made of metal and ceramic components. A typical construction includes a pair of terminal pins brazed to the ends of an Ni—Cr coil, which is then disposed axially through a U-shaped tubular metal sheath. The resistance coil is insulated from the metal sheath by a powdered ceramic material, which is usually magnesium oxide.

While such conventional heating elements have been the standard for the water heater industry for decades, there have been a number of widely recognized deficiencies. For example, galvanic currents occurring between the metal sheath and any exposed metal surfaces in the tank can create corrosion of the various anodic metal components of the system. The metal sheath of the heating element, which is typically copper or copper alloy, also attracts lime deposits from the water, which can lead to premature failure of the heating element. Additionally, the use of brass fittings and copper tubing has become increasingly more expensive as the price of copper has increased over the years.

As an alternative to metal elements, at least one plastic sheath electric heating element has been proposed in U.S. Pat. No. 3,943,328 to Cunningham. In the disclosed device, conventional resistance wire and powdered magnesium oxide are used in conjunction with a plastic sheath. Since this plastic sheath is non-conductive, there is no galvanic cell created with the other metal parts of the heating unit in contact with the water in the tank, and there is also no lime buildup. However, these plastic-sheath heating elements are not capable of attaining high wattage ratings over a normal useful service life, and thus have not been widely accepted. As an alternative, U.S. Pat. Nos. 5,586,214 and 5,930,459 to Eckman et al., which are fully incorporated by reference herein, disclose a heating element having an element body, a supporting surface on the element body, and a resistance wire wound onto the supporting surface that is coated with thermally conductive polymeric coating. This polymeric coating hermetically encapsulates and electrically insulates the resistance wire. While well-suited for its intended purposes, there nonetheless remains a need for alternative coatings that provide the desired electrical and protective properties required for electrical resistance heating elements.

SUMMARY OF THE INVENTION

The above-discussed and other problems and deficiencies of the prior art are overcome or alleviated by the electrical substrate material of the present invention. In accordance with the present invention, it has been discovered that:

(1) in a two component system, the first component (e.g., polybutadiene or polyisoprene resin) is not required to (a) be liquid at room temperature, (b) have a molecular weight less than 5,000, or (c) have pendent vinyl groups, nor is the second component (e.g., the unsaturated butadiene—or isoprene-containing polymer) required to be a "solid" polymer;

(2) the thermosetting composition need not be a two component system, but instead may comprise a single polybutadiene or polyisoprene containing resin component (e.g., without the butadiene or isoprene-containing polymer), or the single resin component may comprise a polybutadiene or polyisoprene-containing polymer such as SBS triblock polymers; and (3) unwoven fibrous webs may be incorporated into dielectric resins of the type described in U.S. Pat. No. 5,223,568 and in the resins systems of (1) and (2) above, whereupon the deficiencies in the prior art related to undesirable dimensional stability and brittleness are dramatically improved with only a relatively small loss in electrical performance. In addition, the resulting electrical laminate may be produced at a relatively low cost, thus permitting the use of the present invention in high volume applications, particularly high volume microwave applications and those uses requiring thin, low cost laminates.

The foregoing discovery is premised, at least in part, on the understanding that a critical part of the invention in U.S. Pat. No. 5,223,568 is heating the thermosetting material to a temperature greater than about 250 C. This high temperature cure step is unconventional for diene polymers such as polybutadiene or polyisoprene resins, with or without the presence of usual or other curatives such as peroxide or sulfur. Thus, it is the high temperature curing step of a polybutadiene or polyisoprene resin that defines this invention. The use of (a) a two component system, (b) a liquid resin, (c) a resin having a MW less than 5,000, (d) pendent vinyl groups, or (e) a solid butadiene or isoprene polymer are not required or even desirable under certain circumstances. The process of this invention thus comprises:

Two Component System

A forming process for producing an article such as an electrical circuit substrate comprising the steps of:

(a) providing a thermosetting composition comprising a polybutadiene or polyisoprene resin; and an unsaturated polybutadiene or polyisoprene containing polymer capable of participating in cross-linking with the polybutadiene or polyisoprene resin during cure; and (b) curing the composition to produce the article (e.g., electrical circuit substrate) by subjecting the composition to a high temperature cure condition at a temperature greater than about 250 C. and less than the decomposition temperature of the composition.

One Component System

A forming process for producing an article such as an electrical circuit substrate comprising the steps of:

(a) providing a thermosetting composition comprising a polybutadiene or polyisoprene resin; and (b) curing the composition to produce the article (e.g., electrical circuit substrate) by subjecting the composition to a high temperature cure condition at a temperature greater than abut 250 C. and less than the decomposition temperature of the composition.

The electrical substrate material of this invention may also include a plurality of woven webs (such as E-glass webs) embedded in a mixture of the polybutadiene or polyisoprene based resin system and optional inorganic filler (e.g., silica) laminated between one or two sheets of conductive foils (e.g., copper) to produce a circuit board material that is especially well suited for microwave applications. Of course, if very thin (e.g., less than 5 mil thickness) cross-sections are desired, then only a single saturated web may be used for the dielectric.

In a further embodiment, the thermosetting compositions of U.S. Pat. No. 5,233,568 and U.S. application Ser. No. 08/238,178, as described above, may further be used to provide thermally conductive coatings for electrical resistance heating elements. Accordingly, an electrical resistance heating element is described, that preferably comprises an electrically conductive, resistance heating member having a pair of free ends joined to a pair of terminal end portions, the resistance heating member being supported by and encapsulated within an integral layer of an electrically insulating, thermally conductive polymeric material, wherein the polymeric layer is formed from a polymerizable composition comprising a polybutadiene or polyisoprene resin. In another embodiment, the polymer coating is formed from 1) a polybutadiene or polyisoprene resin that is liquid at room temperature and that has a molecular weight less than 5,000 and a large number of pendent vinyl groups; and 2) a solid butadiene or isoprene containing polymer such as a thermoplastic elastomer.

In the method of manufacture of the polymer-coated heating element, one of the two above-described compositions is coated onto an electrical resistance heating element by overmolding using processes such as compression molding or injection molding.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several Figures.

DESCRIPTION OF THE PREFERRED EMBODIMENT

Figure 1:
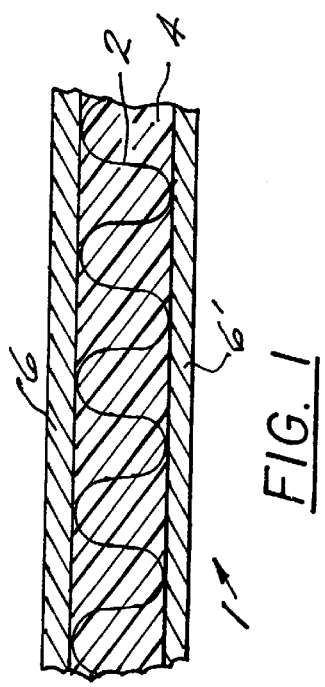
FIG. 1 is a cross-sectional elevation view of a circuit substrate material in accordance with the present invention.

U.S. Pat. 5,223,568 discloses compositions of 1) polybutadiene or polyisoprene resin that are liquid at room temperature and that have a molecular weight less than 5,000 and a large number of pendent vinyl groups (e.g., first component) and 2) a solid butadiene or isoprene containing polymer such as a thermoplastic elastomer (e.g., second component). A critical part of the invention is disclosed to be heating this material to a cure temperature which is unconventional for diene polymers, with or without the presence of usual or other curatives such as peroxide or sulfur, during which a very high degree of crosslinking is effected. It can be inferred that, during this high temperature cure step, many existing covalent bonds are broken and many new bonds are formed, thereby increasing the crosslinking between chain units to a remarkable degree. As will be discussed hereinafter, it is the high temperature cure of a polybutadiene or polyisoprene resin system that defines this invention. It has been discovered that the use of either (a) a liquid resin or (b) a resin having a MW less than 5,000 or (c) a solid butadiene or isoprene polymer is simply an optional embodiment for the polybutadiene or polyisoprene resin system.

More particularly, it has been discovered that the molecular weight of the polybutadiene or polyisoprene resin is not critical to the remarkable reactions described above. Mixing equipment is well able to mix a high molecular weight polymer with another, and also to disperse large amounts of filler in such polymeric mixtures. The liquid resins mentioned in U.S. Pat. No. 5,223,568 were convenient for preparing compounds which could be processed easily with more filler, and molded in more ways (due to fewer limitations imposed by high viscosity) than would be possible using higher molecular weight polymers. Indeed, it is a common practice to compound and mold high molecular weight rubber with large amount of filler (e.g. carbon blacks, silicas, etc.). The chemical reactions due to the high temperature (greater than 250° C.) are expected to take place between proximately placed polymer chain units, be they from low or high molecular weight polymer molecules. The end result is still a remarkable degree of network formation, although it may take even fewer crosslinking reactions starting with high molecular weight polymer (In other words, under some circumstances, the high temperature cure cycle may be reduced with a high molecular weight resin). The polymers of the polybutadiene or polyisoprene resin therefore need to be neither liquid nor limited to 5000 molecular weight or less.

It has likewise been discovered that "solid" butadiene and isoprene containing resins (e.g., the second component) are also not critical to the remarkable reactions described above. As will be discussed in detail hereinafter, the unsaturated butadiene or isoprene containing polymer may be a liquid as well as a solid, and, indeed, the second component need not even be present in the polybutadiene or polyisoprene resin system as long as the high temperature cure takes place.

U.S. Pat. No. 5,223,568 relies on an unusually high temperature cure condition, which is capable of developing extremely high degrees of cure in certain common polymeric materials. The unexpected nature of the discovery embodied in U.S. Pat. No. 5,223,568 is exemplified by the uniqueness of the results, which provide a highly sought result in the area of polymeric circuit substrates for use in making high frequency and high signal transmission speed circuits. These attributes include dielectric properties that are stable over broad ranges of temperature and frequency, and resistance to the rigors of circuit fabrication operations.

What makes the invention disclosed in U.S. Pat. No. 5,223,568 particularly desirable is that the desirable properties are achieved using common and relatively inexpensive polymeric starting materials: polymers and copolymers of butadiene or isoprene. Performance as a dielectric material is even superior to very expensive thermosetting or rigid high temperature thermoplastic polymeric materials (e.g., benzocyclobutene polymers, cyanate ester polymers, polyimides, polyether ether ketones and others). This is due to low dissipation factor, the absence of a major polymeric transition up to at least 300° C. (which causes unwanted increases in thermal expansion and shifts in dielectric constant and dissipation factor), low dissipation factor, relatively low dielectric constant, low water absorption, and high resistance to caustics and organic solvents used in circuit board manufacture. The rigidity of the material makes it superior in some circuit fabrication operations to polytetrafluoroethylene, which is another high quality (but soft) polymer for circuit substrates.

The polymeric system as described in U.S. Pat. No. 5,223,568 was aimed at a specific useful embodiment of the concept of the invention. The embodiment was mixtures of liquid (low molecular weight) polybutadiene or polyisoprene polymer and rubbery (high molecular weight) butadiene or isoprene copolymers which were tailored to a mixing process available for their fabrication. The use of liquid rubber made possible very high loadings of filler without excessive viscosity of the mix. However, in accordance with the present invention, it has now been discovered that the liquid (or low molecular weight) polybutadiene or polyisoprene resin is not necessary to make a useful article. Instead, the polybutadiene or polyisoprene resin may be solid as well as liquid. For example, if the mixing were carried out using an appropriate organic solvent which was later evaporated after the products were formed (e.g., cast films), or, if significantly lower loadings of filler were used, such low molecular weight requirements could be removed. It has been determined that chemically similar polymers of either high molecular weight or low molecular weight (liquid) undergo essentially similar reactions at the very high cure temperatures of the invention. In Example 1 (as will be discussed below), the only polymer used is a high molecular weight polybutadiene rubber, mixed with high level of filler with the aid of xylene, which is solvent for the polymer.

The use of a high molecular weight rubbery component (e.g., second component) in addition to the liquid rubber (e.g., first component) in examples of U.S. Pat. No. 5,223, 568 was to address other problems encountered when a liquid rubber was used. One of these was a tendency for the liquid resin to separate from the filler during certain molding operations due to a sieving effect. This separation was unacceptable for highest quality dielectric materials where uniformity of dielectric constant is important throughout the circuit element, since filler separation would result in non-uniform dielectric constant. The styrene/butadiene/styrene rubbery copolymer was used to adjust viscosity to counteract this effect. But other high molecular weight butadiene polymer can be used. Example 3 shows that an acceptable product can be produced when in lieu of the SBS, a syndiotactic 1,2-polybutadiene rubber is used in combination with a liquid polybutadiene rubber.

The resin system, fillers, cross-linking agents, woven web, processing conditions and representative constructions together with Examples will now be discussed in detail.

Resin System

The resin system used in the electrical substrate material of this invention is a thermosetting composition generally comprising (1) a polybutadiene or polyisoprene resin (or mixture thereof); and (2) an optional unsaturated butadiene- or isoprene-containing polymer capable of participating in cross-linking with the polybutadiene or polyisoprene resin during cure. The polybutadiene or polyisoprene resins may be liquid or solid at room temperature. Liquid resins may have a molecular weight greater than 5,000, but preferably have a molecular weight of less than 5,000 (most preferably between 1,000 or 3,000). The preferably liquid (at room temperature) resin portion maintains the viscosity of the composition at a manageable level during processing to facilitate handling, and it also crosslinks during cure. Polybutadiene and polyisoprene resins having at least 90% 1,2 addition by weight are preferred because they exhibit the greatest crosslink density upon cure owing to the large number of pendent vinyl groups available for crosslinking. High crosslink densities are desirable because the electrical circuit substrates exhibit superior high temperature properties. A preferred resin is B3000 resin, a low molecular weight polybutadiene liquid resin having greater than 90 weight percent (wt. %) 1,2 addition. B3000 resin is commercially available from Nippon Soda, Ltd.

The optional unsaturated butadiene- or isoprene-containing polymer preferably comprises a thermoplastic elastomer, and more preferably includes a linear or graft-type block copolymer that preferably has a polybutadiene or polyisoprene block with at least 90 wt. % of 1,2 addition and a thermoplastic block that preferably is styrene or a-methyl styrene. The high proportion of 1,2 addition in the polyisoprene or polybutadiene block leads to high crosslink densities after the curing step, as is the case with the polybutadiene or polyisoprene resin described above. A preferred copolymer is a styrene-butadiene styrene triblock copolymer, e.g., Kraton DX1300 (commercially available from Shell Chemical Corp.).

U.S. Pat. No. 5,223,568 emphasizes polymers containing greater levels of 1,2-butadiene over 1,4-butadiene addition because crosslinking occurs more readily and a more rapid cure is possible due to the pendent double bonds in the 1,2-form. But in accordance with yet another feature of the present invention, it has been discovered that the thermal reactions occurring in high 1,2-butadiene addition polymers, are also manifest in other butadiene polymers as described in more detail in Example 4. Example 4 demonstrates that in a single component system, the thermosetting composition may comprise an unsaturated butadiene or isoprene-containing polymer such as SBS copolymer.

The unsaturated butadiene- or isoprene-containing polymer may also contain a second block copolymer similar to the first except that the polybutadiene or polyisoprene block is hydrogenated, thereby forming a polyethylene block (in the case of polybutadiene) or an ethylene-propylene copolymer (in the case of polyisoprene). When used in conjunction with the first copolymer, materials with particularly low coefficients of thermal expansion can be produced. Where it is desired to use this second block copolymer, a preferred material is Kraton GX1855 (commercially available from Shell Chemical Corp.), which is believed to be a mixture of styrene-high 1,2 butadiene-styrene block copolymer and styrene-(ethylene-propylene)-styrene block copolymer. Particularly preferred compositions are those in which the resin is polybutadiene, the first block copolymer is styrene-butadiene-styrene triblock copolymer (m=n=1), and the second block is styrene-(ethylene-propylene)-styrene triblock copolymer (m=n=1), the ethylene-propylene block being the hydrogenated form of an isoprene block.

Thus, in a preferred embodiment, the unsaturated polymer comprises a solid thermoplastic elastomer block copolymer having the formula $X_m(Y—X)_n$ (linear copolymer) or

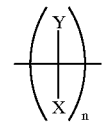

(graft polymer), where Y is a polybutadiene or polyisoprene block, X is a thermoplastic block, and m and n represent the average block numbers in the copolymer, m is 0 or 1 and n is at least 1. The composition may further include a second thermoplastic elastomer block copolymer having the formula $W_p—(Z—W)_q$ (linear copolymer) or

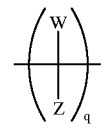

(graft copolymer) where Z is a polyethylene or ethylene-propylene copolymer block, W is a thermoplastic block, and p and q represent the average block numbers in the copolymer, p being 0 and 1 and q being at least 1.

Preferably, the polybutadiene or polyisoprene resin and the polybutadiene or polyisoprene block of the first block copolymer making up the thermoplastic elastomer have at least 90% by weight 1,2 addition. The volume to volume ratio of the polybutadiene or polyisoprene to the thermoplastic elastomer preferably is between 1:9 and 9:1, inclusive.

Crosslinking Agent

A crosslinking agent having a functionality of $\geq 2$ is added to the thermosetting composition to increase crosslink density upon cure. Examples of preferred crosslinking agents include triallylcyanurate, diallyl phthalate, divinyl benzene, and multifunctional acrylate monomers (e.g., Sartomer resins available from Arco Specialty Chemicals Co.), or combinations thereof, all of which are commercially available. The volume % of the crosslinking agent as a percentage of the combined volume of the resin, thermoplastic elastomer, and crosslinking agent is preferably less than or equal to 20.

Particulate Fillers

When the resin system includes a dielectric filler, for example for use as circuit boards, the volume % of the filler (based upon the combined volume of resin system, crosslinking agent (if any) and filler) is between 5 and 80%, inclusive, and preferably between 40% and 70%. Examples of preferred fillers include titanium dioxide (rutile and anatase), barium titanate, strontium titanate, silica (particles and hollow spheres) including fused amorphous silica; corundum, wollastonite, polytetrafluoroethylene, aramide fibers (e.g., Kevlar), fiberglass, $Ba_2Ti_9O_{20}$, glass spheres, quartz, boron nitride, aluminum nitride, silicon carbide, beryllia, or magnesia. They may be used alone or in combination.

Particularly preferred fillers are rutile titanium dioxide and amorphous silica because these fillers have a high and low dielectric constant, respectively, thereby permitting a broad range of dielectric constants combined with a low dissipation factor to be achieved in the final cured product by adjusting the respective amounts of the two fillers in the composition. To improve adhesion between the fillers and resin, coupling agents, e.g., silanes, are preferably used.

Preferred particulate fillers for compositions used as electrical resistance heating elements include, but are not limited to, electrically insulating fillers with high thermal conductivities such as crystalline silica (quartz), magnesium oxide, aluminum oxide, titanium dioxide, silicon carbide, boron nitride, and others. Such fillers may be present in an amount of about 5 to about 80, and preferably from about 50 to about 80 percent by volume based on the total composition.

Additives

The polymers may further be mixed with various other additives for improving thermal conductivity, impact properties, mold-release properties, and thermo-oxidative stability. Thermal conductivity can be improved with the addition of metal oxides, nitrides, carbonates or carbides (hereinafter sometimes referred to as "ceramic additives"), and low concentrations of carbon or graphite. Such additives can be in the form of powder, flake or fibers. Exemplary materials include oxides, carbides, carbonates, and nitrides of tin, zinc, copper, molybdenum, calcium, titanium, zirconium, boron, silicon, yttrium, aluminum or magnesium, or, mica, glass ceramic materials or fused silica. When present, the thermally conducting materials are preferably within a range from about 60 to about 200 parts of additive per 100 parts of resin ("PPH"), and more preferably about 80 to about 180 PPH. These additives are generally non-electrically conductive, although conductive additives, such as metal fibers and powder flakes, of metals such as stainless steel, aluminum, copper or brass, and higher concentrations of carbon or graphite, could be used if thereafter overmolded, or coated, with a more electrically insulated polymeric layer. If an electrically conductive additive is employed, care must be given to electrically insulate the core to prevent shorting between the coils. The amounts of the above additives should not impair molding operations.

Curing Agent

A curing agent is preferably added to the composition to accelerate the curing reaction. When the composition is heated, the curing agent decomposes to form free radicals, which then initiate crosslinking of the polymeric chains. Preferred curing agents are organic peroxides, e.g., dicumyl peroxide, and t-butylperbenzoate, all of which are commercially available.

Fiber Reinforcing Additives

The fiber reinforcing additives can comprise woven, thermally stable webs of a suitable fiber, preferably glass fibers (E, S and D glass) or high temperature polyester fibers (KODEL from Eastman Kodak). The fiber web is present in an amount of about 5 to 45 weight percent with respect to the entire resin system/filler composition. Such thermally stable fiber reinforcement (having a thermal stability of above 260° C.) provides the circuit laminate of the present invention with the ability to withstand high temperatures during processing and more specifically solder melting temperatures. In addition, the use of the glass or high temperature polyester web reinforcement renders the dielectric substrate with relatively high mechanical strength.

Preferred examples of the woven fiberglass web used in the present invention are set forth in the following Table 1.

TABLE 1

| Manufacturer | Style | Thickness (inches) |
| --- | --- | --- |
| Fiber Glast | 519-A | 0.0015 |
| Clark-Schwebel | 112 | 0.0032 |

TABLE 1-continued

| Manufacturer | Style | Thickness (inches) |
| --- | --- | --- |
| Clark-Schwebel | 1080 | 0.0025 |
| Burlington | 1165 | 0.0042 |
| Burlington | 1610 | 0.0035 |

When used as coating compositions for electrical resistance heating elements, the compositions can contain from about 0 to about 50 wt. % inorganic and/or polymeric fiber reinforcement to increase strength. Short glass fibers are preferred, preferably in amounts from about 10 to about 50 wt. %, most preferably from about 20 to about 35 wt. % based on the total weight of the composition. An amount of about 30 wt. % based on the total composition increases tensile strength of engineering plastics by a factor of about two. Preferred fibers include chopped glass, such as E-glass or S-glass, boron, aramide, such as Kevlar 29 or 49, heat-treated polyphenylene benzobisthiazole (PBT) and polyphenylene benzobisoxozole (PBO) fibers.

Processing

In general, the thermosetting compositions are processed as follows. First, all the ingredients (polybutadiene or polyisoprene resin, optional thermoplastic elastomer, fillers and coupling agent) are thoroughly mixed in conventional mixing equipment along with a peroxide curing agent. The mixing temperature is regulated to avoid substantial decomposition of the curing agent (and thus premature cure). Mixing continues until the filler is uniformly dispersed throughout the resin. Filler may be pretreated with coupling agents (preferably silanes) in a separate step for more efficient use of the agents.

For those applications where the composition is to impregnate a woven web forming a prepreg, conventional prepreg manufacturing methods can be employed. Typically the web is impregnated with the slurry, metered to the correct thickness, and then the solvent removed to form a prepreg.

The lamination process entails a stack-up of one or more saturated woven webs (or a non-saturated woven web sandwiched between two bond plys) between one or two sheets of conductive foil (copper). The stack-up is then cured (via lamination) in a two step curing cycle.

First, the stack-up is cured in a conventional peroxide cure step; typical cure temperatures are between 150 and 200° C. Next, the peroxide-cured stack-up is subjected to a high temperature cure step under an inert atmosphere to increase crosslink density. The temperature is greater than about 250° C. but less than the decomposition temperature of the resin (typically about 400° C.). The high temperature cure can be observed to impart an unusually high degree of crosslinking to the final laminate. This high temperature cure is preferably carried out in an oven but can also be performed in a press, namely as a continuation of the initial lamination step.

Alternatively, if the polybutadiene or polyisoprene resin is solid, this solid resin is mixed with a solvent to form a solution well suited for casting. Thereafter, the solvent is removed and the cast resin system is subjected to the aforementioned cure cycle.

Referring now to FIG. 1, a cross-sectional view of electrical substrate material in accordance with the present invention is shown generally at 1. Electrical substrate 1 has been laminated in accordance with one of the processes described above wherein a woven web 2 is embedded in a resin system/filler composition 4 and laminated between two copper foils 6, 6' to produce a circuit board laminate. As discussed above with reference to the processing conditions, the resin system 4 may either be cast onto woven web 2 using known casting equipment, or web 2 may be saturated by resin system 4 by sandwiching web 2 between a pair of bond plys formed from resin system 4 and laminating the stack up together with the copper cladding 6, 6'. While FIG. 1 depicts a single layer of woven web 2, it will be appreciated that typically a plurality of layers of saturated web 2 will be used in forming circuit laminates in accordance with the present invention. However, a single layer as shown in FIG. 1 is desirable where very thin cross-sections (less than 5 mils) are required.

In a further embodiment, electrical resistance heating elements and water heaters containing these elements are described, wherein the electrical resistance heating elements comprise a coating formed by high temperature cure of a polybutadiene or polyisoprene resin system, and optional unsaturated polymer, filler, reinforcing filler, crosslinking agent, and cure agent. Coated electrical resistance heating elements are useful in minimizing galvanic corrosion within water and oil heaters, as well as lime buildup and problems of shortened element life, and are described in U.S. Pat. No. 5,586,214 to Eckman and U.S. Pat. No. 5,930,459 to Eckman et al., both of which are incorporated by reference herein.

Figure 4:
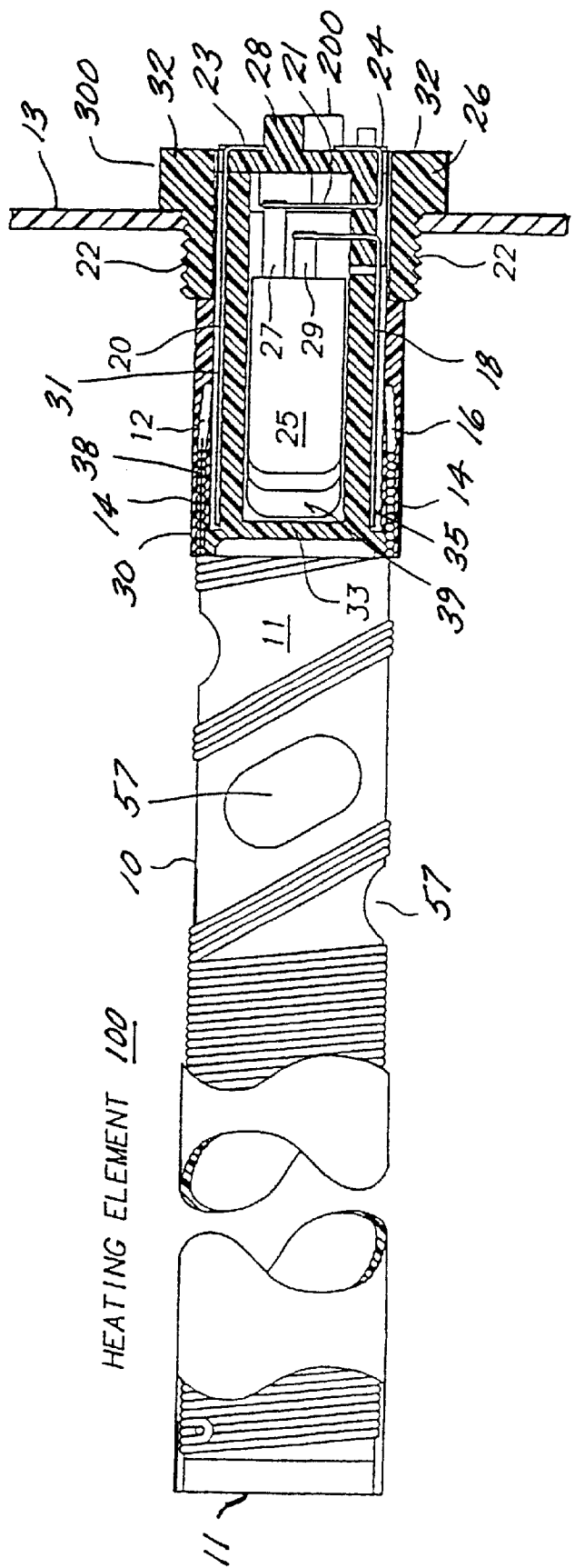
FIG. 4 is a front planar view, including partial cross-sectional and peel-away views, of one embodiment of a fluid heater.

With reference to FIG. 4, there is shown a preferred fluid heater 100. As used herein, the terms "fluid" and "fluid medium" apply to both liquids and gases. Fluid heater 100 contains an electrically conductive resistance heating material used to conduct electrical current and generate heat. This resistance heating material can be in the form of a coil 14, or a wire, mesh, ribbon, or serpentine shape, for example. Coil 14 has a pair of free ends joined to a pair of terminal end portions 12 and 16 is provided for generating resistance heating. Suitable resistance heating materials are electrically conductive and heat resistant and include but are not limited to metals such as Ni—Cr alloys, copper, steel and stainless-steel alloys, and conductive polymers containing graphite, carbon or metal powders or fibers, for example. Other electrical conductors of the preferred polymeric fluid heater 100 can also be manufactured using these conductive materials.

Coil 14 is hermetically and electrically insulated from fluid with an integral layer of a high temperature polymeric material 30 such that the active resistance heating material is protected from shorting out in the fluid by the polymeric coating formed by high temperature cure of a polybutadiene or polyisoprene resin system and optional unsaturated polymer, filler, crosslinking agent, and cure agent as described above in U.S. Pat. No. 5,233,568. These cured polymers will not deform significantly or melt at fluid medium temperatures of about 120–180° F. and coil temperatures of about 450–650° F. Preferably, the tensile strength of the polymeric coating should be at least about 7,000 psi and preferably about 7,500–10,000 psi provided that satisfactory thermal conductivity is maintained. The flexural modulus at operating temperatures should be at least about 500 KPsi, and preferably greater than 1000 KPsi.

Use of these polymeric materials to coat the metal sheath of conventional electric resistance heating elements avoids many of the problems previously experienced with such elements, whether copper, stainless steel, or non-corrosion resistant materials such as carbon steel. For corrosion-resistant materials, the coating should be relatively thinner than for non-corrosion resistant materials, and this should require coatings of at least about 10 mils and higher thermal conductivity values.

The part to be coated is placed in an injection mold and then is overmolded with one of the preferred polymeric resin compositions of this invention. Compression molding and injection molding are preferred.

Again with reference to FIG. 4, a preferred fluid heater 100 generally comprises three integral parts: a termination assembly 200, an inner mold 300, and a polymeric coating 30.

Inner mold 300 may be a single-piece injection molded component made from a rigid, high temperature polymer, and preferably includes a flange 32 at its outermost end, adjacent a collar portion having a plurality of threads 22. The threads 22 are designed to fit within the inner diameter of a mounting aperture through the sidewall of a storage tank, for example in a water heater tank 13. Inner mold 300 also includes a thermistor cavity 39 located within its preferred circular cross-section. Thermistor cavity 39 can include an end wall 33 for separating the thermistor 25 from fluid, and is preferably open through the flange 32 so as to provide easy insertion of the termination assembly 200. Inner mold 300 also contains at least a pair of conductor cavities 31 and 35 located between the thermistor cavity 39 and the outside wall of the inner mold for receiving the conductor bar 18 and terminal conductor 20 of the termination assembly 200. Inner mold 300 also contains a series of radial alignment grooves 38 disposed around its outside circumference. These grooves can be threads or unconnected trenches or the like, and should be spaced sufficiently to provide a seat for electrically separating the helices of coil 14.

The termination assembly 200 comprises a polymer end cap 28 designed to accept a pair of terminal connections 23 and 24. The terminal connections 23 and 24 may contain threaded holes for accepting a threaded connector, such as a screw, for mounting external electrical wires. The terminal connections 23 and 24 are the end portions of terminal conductor 20 and thermistor conductor bar 21. Thermistor conductor bar 21 electrically connects terminal connection 24 with thermistor terminal 27. The other thermistor terminal 29 is connected to thermistor conductor bar 18 which is designed to fit within conductor cavity 35. To complete the circuit, a thermistor 25 is provided. Optionally, the thermistor 25 can be replaced with a thermostat, a solid-state TCO or a grounding band that is connected to an external circuit breaker, or the like. It is believed that the grounding band (not shown) could be located proximate to one of the terminal end portions 16 or 12 so as to short-out during melting of the polymer. In a preferred embodiment, thermistor 25 is a snap-action thermostat/thermoprotector such as the Model W Series sold by Portage Electric. This thermoprotector has compact dimensions and is suitable for 120/240 VAC loads. It comprises a conductive bimetallic construction with an electrically active case. End cap 28 is preferably a separate molded polymeric part.

Termination assembly 200 and inner mold 300 are preferably assembled together prior to winding coil 14 over the alignment grooves 38 of the active element portion 10. A completed circuit with the coil terminal end portions 12 and 16 must be formed. This can be assured by brazing, soldering or spot welding the coil terminal end portions 12 and 16 to the terminal conductor 20 and thermistor conductor bar 18. It is also important to properly locate the coil 14 over the inner mold 300 prior to applying the polymer coating 30. In the preferred embodiment, the polymer coating 30 is overmolded to form a thermoplastic polymeric bond with the inner mold 300. As with the inner mold 300, core pulls can be introduced into the mold during the molding process to keep the flow-through apertures 57 and flow-through cavity 11 open.

The alignment grooves 38 of the inner mold 300 are used to wrap a first wire pair having helices into a coil form. Since the preferred embodiment includes a folded resistance wire, the end portion of the fold or helix terminus is capped by folding it around a pin. The pin ideally is part of, and injection molded along with, the inner mold 300.

Similarly, a dual resistance wire configuration can be provided. In this embodiment, the first pair of helices of the first resistance wire are separated from the next consecutive pair of helices in the same resistance wire by a secondary coil helix terminus wrapped around a second pin. A second pair of helices of a second resistance wire, which are electrically connected to the secondary coil helix terminus, are then wound around the inner mold 300 next to the helices in the next adjoining pair of alignment grooves. Although the dual coil assembly shows alternating pairs of helices for each wire, it is understood that the helices can be wound in groups of two or more helices for each resistance wire, or in irregular numbers, and winding shapes as desired, so long as their conductive coils remain insulated from one another by the inner mold, or some other insulating material, such as separate plastic coatings, and the like.

Figure 5:
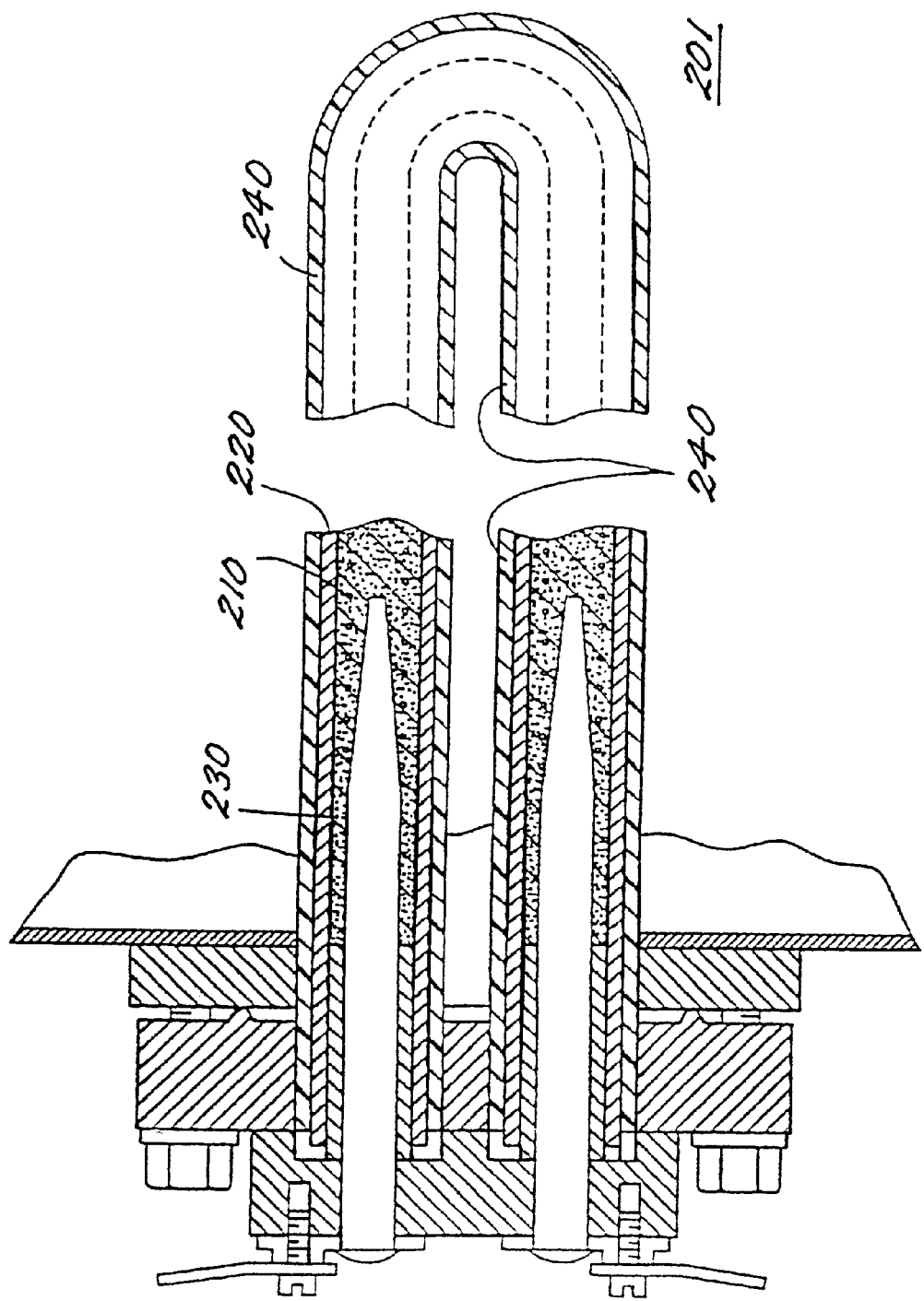
FIG. 5 is a cross-sectional side view of an improved metal sheathed element equipped with a thermally conductive polymer coating as in one embodiment of this invention.

An improved version of a conventional electric resistance heating element 201 is shown in FIG. 5. Element 201 has a resistance heating wire disposed axially through a U-shaped tubular metal sheath 220 with powdered ceramic material 230 between wire 210 and metal sheath 220. Sheath 220 is then coated with a highly thermally conductive polymeric coating 30 of this invention to prevent galvanic currents occurring between the metal sheath and any exposed anodic metal components of the system. The excellent thermal conductivity of the polymeric materials permits the heating elements to attain the high wattage ratings necessary to heat water efficiently to temperatures in excess of 120° F. without melting the coating.

Figure 6:
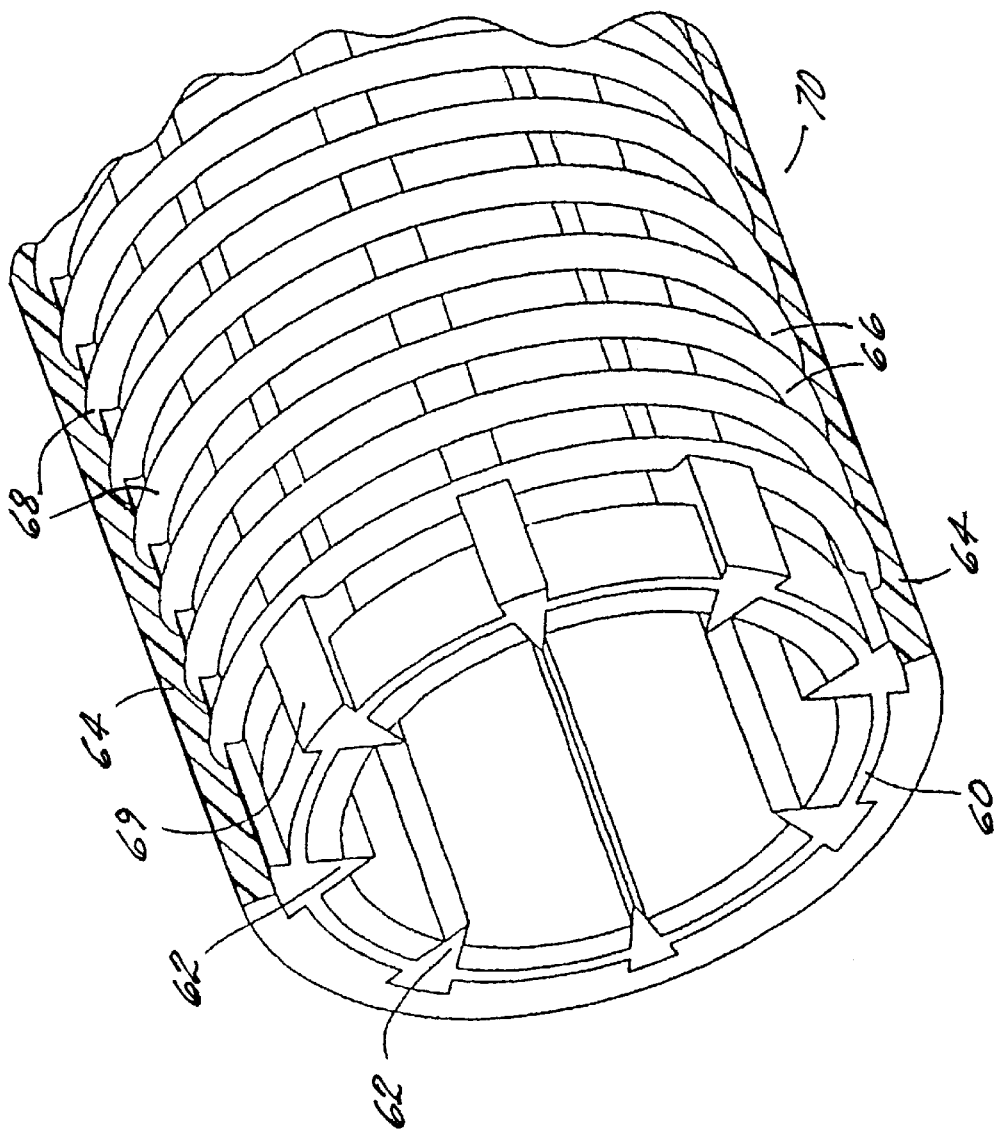
FIG. 6 is an enlarged partial view of a preferred skeletal support frame of one embodiment of the present invention.

FIG. 6 shows a skeletal support frame that has been demonstrated to provide additional benefits relative to inner mold 300. Skeletal support frame 70 has a plurality of openings and a support surface for retaining resistance heating wire 66. In a preferred embodiment, the skeletal support frame 70 includes a tubular member having about 6 to 8 spaced longitudinal splines 69 running the entire length of frame 70. Splines 69 are held together by a series of ring supports 60 longitudinally spaced over the length of the tube-like member. Ring supports 60 are preferably less than about 0.05 inches thick, and more preferably from about 0.025 to about 0.030 inches thick. Splines 69 are preferably about 0.125 inches wide at the top and desirably are tapered to a pointed heat transfer fin 62. Fins 62 should extend at least about 0.125 inches beyond the inner diameter of the final element after the polymeric coating 30 has been applied, and, as much as 0.250 inches, to effect maximum heat conduction into fluids.

The outer radial surface of splines 69 preferably includes grooves which can accommodate a double helical alignment of resistance heating wire 66. Although the heat transfer fins 62 are described as being part of the skeletal support frame 70, fins 62 can be fashioned as part of the ring supports 60 or the overmolded polymeric coating 30, or from a plurality of these surfaces. Similarly, heat transfer fins 62 can be provided on the outside of splines 69 so as to pierce beyond polymeric coating 30. Additionally, a plurality of irregular or geometrically shaped bumps or depressions may be provided along the inner or outer surface of the provided heating elements. Such heat transfer surfaces facilitate the removal of heat from surfaces into liquids. They can be provided in a number of ways, including injection molding them into the surface of polymeric coating 30 or fins 62, etching, sandblasting, or mechanically working the exterior surfaces of the heating elements.

In one preferred embodiment, only a small portion of the heat transfer fin 62 remains exposed to contact fluid, the remainder of the skeletal support frame 70 is covered with the molded resin on both the inside and outside, if it is tubular in shape. This exposed portion is preferably less than about 10 percent of the surface area of the skeletal support frame 70. The open cross-sectional areas, constituting the plurality of openings of the skeletal support frame 70, permit easier filling and greater coverage of the resistance heating wire 66 by the molded resin, while minimizing the incidence of bubbles and hot spots. In preferred embodiments, the open areas should comprise at least about 10 percent and desirably greater than 20 percent of the entire tubular surface area of the skeletal support frame 70, so that molten polymer can more readily flow around the support frame 70 and resistance heating wire 66.

Figure 7:
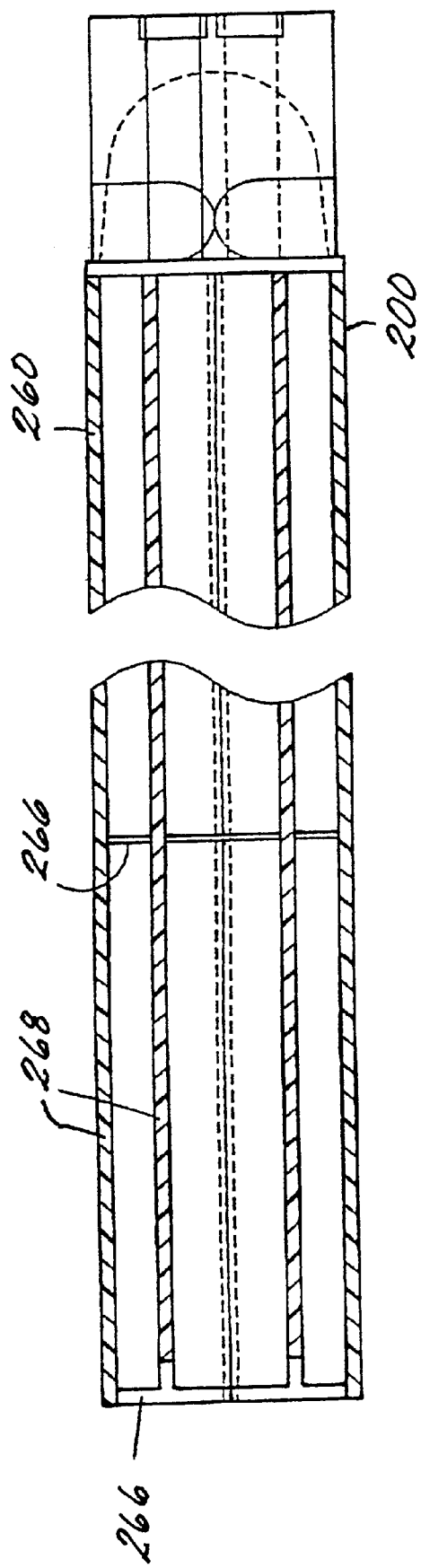
FIG. 7 is a front plan view of the full skeletal support frame of one embodiment of the present invention.

An alternative skeletal support frame 200 is illustrated in FIG. 7. The alternative skeletal support frame 200 also includes a plurality of longitudinal splines 268 having spaced grooves 260 for accommodating a wrapped resistance heating wire (not shown). The longitudinal splines 268 are preferably held together with spaced ring supports 266. The spaced ring supports 266 include a "wagon wheel" design having a plurality of spokes and a hub. This provides increased structural support over the skeletal support frame 70, while not substantially interfering with the preferred injection molding operations.

The inner mold 300 and the skeletal support frame 70 preferably comprise a rigid, high temperature polymer which preferably will not deform significantly or melt at fluid medium temperatures of about 120 to about 180° F. and coil temperatures of about 450 to about 650° F. Thermoplastic polymers having a melting temperature greater than 200° F., and preferably greater than the coil temperature, are most desirable, although certain ceramics and thermosetting polymers could also be useful. Exemplary thermoplastic materials include but are not limited to fluorocarbons, polyaryl-sulphones, polyimides, bismaleimides, polyphthalamides, poly(ether ether ketones), polyphenylene sulphides, polyether sulphones, and mixtures and copolymers of these thermoplastics. Thermosetting polymers which would be acceptable include but are not limited to polyimides, certain epoxies, phenolics, and silicones. Liquid-crystal polymers ("LCPs") can also be employed for improving high temperature properties. Polyphenylene sulphide ("PPS") is most preferred because of its elevated temperature service, low cost and easier processability, especially during injection molding.

The rigid, high temperature polymers can contain from about 5 to about 60 wt. % fiber reinforcement to increase strength. For example, short glass fibers at about 30 wt. % loading increase tensile strength of engineering plastics by a factor of about two. Preferred fibers include chopped glass, such as E-glass or S-glass, boron, aramide, such as Kevlar 29 or 49, heat-treated polyphenylene benzobisthiazole (PBT) and polyphenylene benzobisoxozole (PBO) fibers, and graphite and carbon fibers, including high tensile modulus graphite and 2% strain carbon/graphite fibers.

The polymers may further be mixed with various other additives for improving thermal conductivity, impact properties, mold-release properties, and thermo-oxidative stability. Thermal conductivity can be improved with the addition of metal oxides, nitrides, carbonates or carbides (hereinafter sometimes referred to as "ceramic additives"), and low concentrations of carbon or graphite. Such additives can be in the form of powder, flake or fibers. Exemplary materials include oxides, carbides, carbonates, and nitrides of tin, zinc, copper, molybdenum, calcium, titanium, zirconium, boron, silicon, yttrium, aluminum or magnesium, or, mica, glass ceramic materials or fused silica. When present, the thermally conducting materials are preferably within a range from about 60 to about 200 parts of additive per 100 parts of resin ("PPH"), and more preferably about 80 to about 180 PPH. These additives are generally non-electrically conductive, although conductive additives, such as metal fibers and powder flakes, of metals such as stainless steel, aluminum, copper or brass, and higher concentrations of carbon or graphite, could be used if thereafter overmolded, or coated, with a more electrically insulated polymeric layer. If an electrically conductive additive is employed, care must be taken to electrically insulate the core to prevent shorting between the coils. The amounts of the above additives should not impair molding operations.

In a preferred embodiment, the skeletal support frame 70 comprises one of the above-described thermoplastic resins with a small amount of glass fibers for structural support, and optionally ceramic powder, such as $Al_2O_3$ or MgO, for improving thermal conductivity. Alternatively, the skeletal support frame can be a fused ceramic member, including one or more of alumina silicate, $Al_2O_3$, MgO, graphite, $ZrO_2$, $Si_3N_4$, $Y_2O_3$ $SiO_2$, SiC, and the like. If a thermoplastic is used for the skeletal support frame 70 it should have a heat deflection temperature greater than the temperature of the molten polymer used to mold the coating 30.

The standard rating of the preferred polymeric fluid heaters of this invention used in heating water is 240 V and 4500 W, although the length and wire diameter of the conducting coils 14 can be varied to provide multiple ratings from 1000 W to about 6000 W, and preferably between about 1700 W and 4500 W. For gas heating, lower wattages of about 100–1200 W can be used. Dual, and even triple wattage capacities can be provided by employing multiple coils or resistance materials terminating at different portions along the active element portion 10.

From the foregoing, it can be realized that this invention provides improved fluid heating elements for use in all types of fluid heating devices, including water heaters and oil space heaters. In certain embodiments, the polymeric fluid heaters can be used in conjunction with a polymeric storage tank so as to avoid the creation of metal ion-related corrosion altogether. Alternatively, these polymeric fluid heaters can be designed to be used separately as their own storage container to simultaneously store and heat gases or fluid. In such an embodiment, the flow-through cavity 11 could be molded in the form of a tank or storage basin, and the heating coil 14 could be contained within the wall of the tank or basin and energized to heat a fluid or gas in the tank or basin. The heating devices could also be used in food warmers, curler heaters, hair dryers, curling irons, irons for clothes, and recreational heaters used in spas and pools.

This invention is also applicable to flow-through heaters in which a fluid medium is passed through a polymeric tube containing one or more of the windings or resistance materials of this invention. As the fluid medium passes through the inner diameter of such a tube, resistance heat is generated through the tube's inner diameter polymeric wall to heat the gas or liquid. Flow-through heaters are useful in hair dryers and in "on-demand" heaters often used for heating water.

Although various embodiments have been illustrated, this is for the purpose of describing and not limiting the invention. Various modifications, which will become apparent to one skilled in the art, or within the scope of this in the attached claims.

EXAMPLES

The following non-limiting examples further describe the electrical substrate material of the present invention.

The following examples 1–4 employ Japan Synthetic Rubber, RB 810 and RB 830 syndiotactic 1,2-polybutadiene (on the order of 200,000 molecular weight, 90% 1,2-addition, respectively); Nippon Soda B3000 liquid 1,2-polybutadiene (>90% 1,2-butadiene addition, about 3000 molecular weight); Shell Chemical Kraton D1300 SBS thermoplastic elastomer (butadiene block about 40 to 50% 1,2-butadiene addition from manufacturer's information), Harbison Walker GP 7I silica, E-glass fiber, gamma-mercaptopropyltrimethoxysilane, t-butylperoxybenzoate, and dicumyl peroxide. Parts are by weight unless indicated otherwise.

TABLE 2

| Component | Ex. 1 | Ex. 2 | Ex. 3 | Ex. 4 |
| --- | --- | --- | --- | --- |
| RB 810 (solid 1,2-PBD) | 17.67 | — | — | — |
| RB 830 (solid 1,2-PBD) | — | — | 10.79 | — |
| B 3000 (liquid 1,2-PPD) | — | 10.40 | — | — |
| B 1300 (SBS) | 7.27 | 7.81 | 33.82 | — |
| Silica | 81.32 | 79.86 | 78.95 | 66.18 |
| E glass fiber | — | 1.46 | 1.44 | — |
| Mercaptosilane | 0.6 | 0.6 | 0.60 | — |
| t-Butyl peroxybenzoate | 0.12 | 0.12 | 0.12 | — |
| Dicumyl peroxide | 0.29 | 0.29 | 0.29 | — |

Example 1 was made by dissolving RB 810, syndiotactic 1,2-polybutadiene in xylene and mixing it with silica, mercaptosilane, and two peroxide curatives; (Table 1 for proportions). The mixing was accomplished by rolling the components with ceramic media overnight on a ball mill at room temperature. The thoroughly mixed solvent slurry was cast as sheets and allowed to dry overnight in a hood to remove the xylene. Material was then dried further at 125° F. for 2 hours in an explosion proof oven. The dried material molded easily using compression molding into 2" thick×2" diameter discs, and ⅛"×2"×5" bars. Transfer molding of the material was not possible into the ⅛" bars due to very high viscosity. The molded pieces were post cured at 300° F. for 2 hours in nitrogen.

Comparison Example 2 has the same composition as Example 1 with two exceptions. The main exception is that the RB 810 syndiotactic 1,2-polybutadiene is replaced by an equal volume percent of a mixture of B 3000 liquid 1,2-polybutadiene and D1300 SBS (the mixture in a 3:2 ratio by volume of B3000 to D1300). The other exception is a small amount of E glass fiber replacing some of the silica added as a processing aid. This material was made without any added solvent on conventional mixing equipment.

Example 3 is similar to Example 2 except the D1300 SBS is replaced by RB 830 syndiotactic 1,2-polybutadiene. (RB 810 and 830 are partially crystalline materials, melting points 71EC and 105EC, respectively).

Example 4 is a composition of Kraton 1300 and silica only, without any added curative or other ingredients. The volume loading of silica is about 45%, which is over 15% lower than the above examples, since mixing took place on conventional polymer mixing equipment and excessive viscosity was undesirable. The material was molded for two hours at 250 C., then a portion was post cured two additional hours at 300 C. under nitrogen. The examples show how properties change with the high temperature cure.

The properties of Examples 1–4 are shown in Table 3 below:

tetrahydrofuran and in 1,1,1-trichloroethane. The unpostbaked materials disintegrated and were significantly dissolved within 4 hours. After one day, the unpostbaked materials were completely disintegrated into a cloudy solution or slurry. The postbaked material remained intact and

TABLE 3

| | Example No. | | | | |
|---|---|---|---|---|---|
| | | | | 4 | |
| Properties | 1 | 2 | 3 | A<br>250° C./<br>2 hr | B<br>250° C./2 hr +<br>300° C./2 hr in $N_2$ |
| Flexural Strength (psi) | 9700 | 16530 | 9650 | — | — |
| Flexural Modulus (MPsi) | 1.72 | 1.72 | 1.73 | — | — |
| Coefficient of Thermal Expansion (ppm/C) (0–140C) | 21.6 | 15.6 | | 80 | 47.8 |
| Dielectric Constant (10 GHz) | 3.2 | 3.25 | 3.23 | — | 3.10 |
| Dissipation Factor (3 GHz) | 0.0012 | 0.0016 | 0.0014 | — | 0.0007 |
| Water Absorption (⅛", 50 C/48 hours) | 0.03 | 0.04 | — | — | — |
| Solvent Absorption (%) (16 hours/RT, 0.028" thick) | | | | | |
| Trichloroethylene | 0.03%* | — | — | 57.6 | 14.5 |
| Acetone | — | 0.59** | — | 3.7 | 0.3 |
| Methylene chloride | — | — | — | 34.0 | 11.4 |

*⅛" thick
**0.05" thick, 1 week

Example 1, a rigid dielectric of high modulus, low dissipation factor, low coefficient of thermal expansion, low water absorption, and low organic solvent absorption, is comparable in relevant properties to Example 2. Example 1 shows that there is no reason not to use higher molecular weight polybutadiene (e.g., greater than 5000) than is associated with liquid polymers. The essence of the invention, that is, the compositions obtained by the unconventionally high temperature cure (e.g., greater than 250° C.) of butadiene polymers, is preserved in Example 1. Example 1 also demonstrates that a single butadiene component (as opposed to a two component system) may be used, if it is appropriate to the mixing and forming processes used.

Example 3 supports the conclusion that various high and low molecular weight butadiene-containing polymer components can be used when appropriate to the whole process.

Example 4 utilizes Kraton D1300 as the polybutadiene resin system. D1300 from Shell is a styrene/butadiene/styrene copolymer in which the center block contains, according to the manufacturer about 40 to 50% 1,2-butadiene addition, while the rest is 1,4-addition. Like other SBS thermoplastic elastomers, D1300 can be molded at moderate temperatures at which the polystyrene blocks soften. At room temperature, such a molded piece acts like a cured rubber, because of hard polystyrene domains which act as physical crosslinks, even though there are no chemical crosslinks. However, because of the uncrosslinked nature of the material, it can still be dissolved completely in a suitable solvent, such as tetrahydrofuran. Two 2" diameter discs of D1300 containing no curatives were molded at about 150° C. One of these discs was exposed to a 300° C. postbake step under an atmosphere of nitrogen. The transformation was dramatic. The unpostbaked material was flexible, rubbery and soft. The postbaked material was hard, rigid and brittle plastic. Quarter sections of the discs were placed into visibly unaffected upon removal of the specimens after one day.

Example 4 thus demonstrates that a ceramic powder filled dielectric substrate can also be based on Kraton D1300 subjected to the high temperature cure operation of U.S. Pat. No. 5,223,568. Example 4 shows the unique combination of unusual cure condition and butadiene polymers transforms an inherently rubbery material to a useful hard plastic, i.e. a new composition of matter.

Example 5

A type 1080 E-glass woven web (45 g/m$^2$) was saturated by casting using a resin system/filler/solvent slurry having the formulations set forth in Table 4 for samples A–R. The web was saturated between two sheets of release paper. Once saturated, one of the release sheets was removed and the solvent evaporated in an oven. The resulting two uncured sheets were then placed together, with the resin-rich sides in contact with each other (webs to the outside) in a press package and laminated at 100 psi for 3 hours at 300° C. under nitrogen between two sheets of copper. In Table 4, the "flat" rating was measured by etching the copper foil off one face and observing the resulting curl of the laminate. The rating scale was 0–5, with 0 being flat and 5 curling up into a tube. The sign of the rating indicates the direction of the curl, with "-" meaning the ends of the laminate curled toward the copper side of the laminate. The "brittle" test was a test based on audible and visual cracking of the laminate when bent. Its rating ranged from 0–5 with 5 being extremely brittle.

TABLE 4

Figure 2:
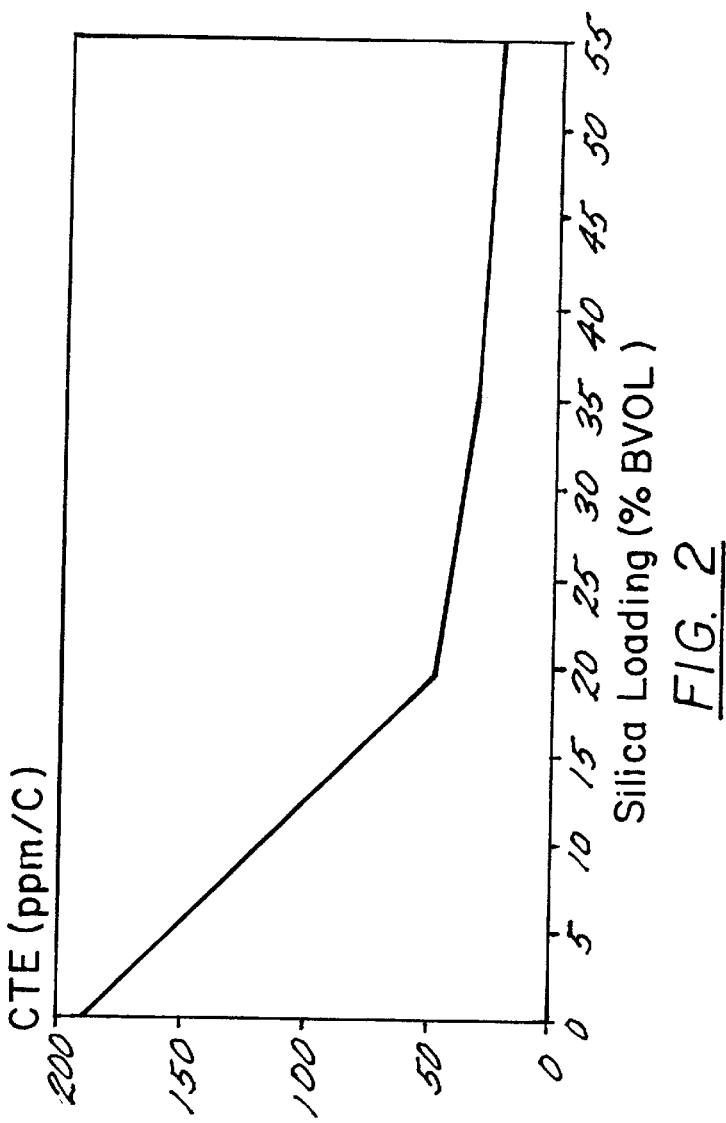
FIG. 2 is a graph depicting CTE vs. filler loading in accordance with a an embodiment of the present invention.
Figure 3:
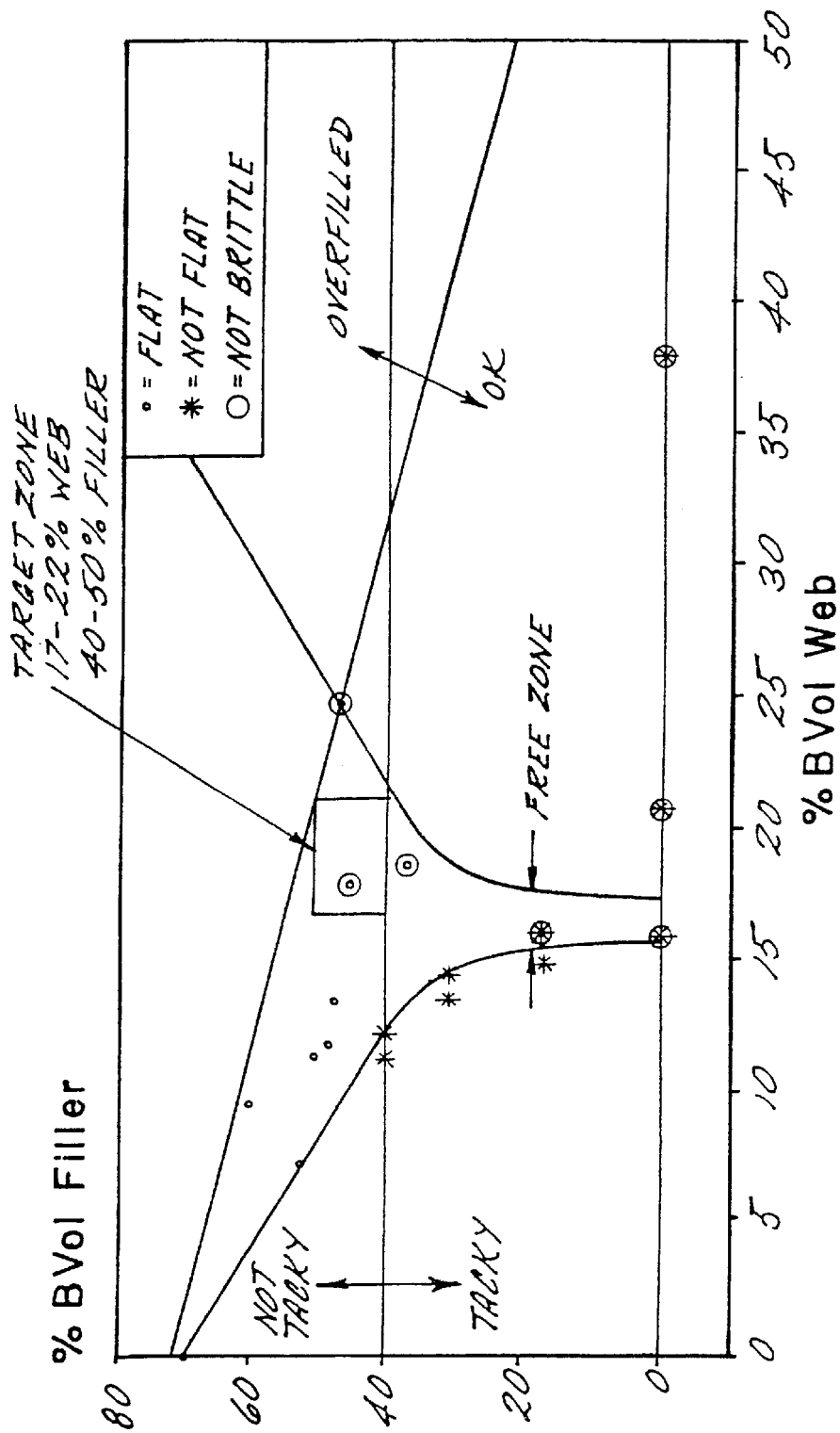
FIG. 3 is a graph depicting different combinations of filler and woven glass web loadings in the present invention.

| No. | Thkns | Vol. % resin | Web | % Filler | SpG | Target SpG | Flat | Peel | DimStab | Brittle | Construction |
|---|---|---|---|---|---|---|---|---|---|---|---|
| A | 0.018 | 79 | 21 | 0 | 1.31 | 1.3 | −2 | — | — | 0 | a |
| B | 0.011 | 62 | 38 | 0 | 1.53 | 1.52 | −4 | — | — | 0 | a |
| C | 0.015 | 29.7 | 10 | 60.3 | 1.88 | 1.88 | 0 | 3.3 | — | 3 | b |
| D | 0.015 | 29.7 | 10 | 60.3 | 1.85 | 1.88 | 0 | 2.2 | — | 3 | c |
| E | 0.015 | 29.7 | 10 | 60.3 | 1.86 | 1.88 | 0 | 3.2 | — | 3 | c |
| F | 0.013 | 46.6 | 11.6 | 39.8 | 1.66 | 1.66 | 4 | 2.7 | −0.152 | 2 | d |
| G | 0.012 | 46.1 | 12.6 | 39.3 | 1.66 | 1.67 | 3 | 2.6 | −0.164 | 2 | e |
| H | 0.012 | 42.6 | 18.9 | 36.5 | 1.71 | 1.74 | 1 | — | −0.083 | 0 | f |
| I | 0.011 | 36.8 | 13.8 | 47.4 | 1.79 | 1.8 | 0 | 2.2 | −0.052 | 2 | g |
| J | 0.0125 | 37.8 | 12.1 | 48.3 | 1.78 | 1.78 | 0 | 1.9 | −0.05 | 3 | h |
| K | 0.0125 | 34.8 | 18.2 | 45 | 1.82 | 1.84 | −1 | — | −0.06 | 0 | i |
| L | 0.011 | 54.1 | 13.8 | 30.2 | — | 1.57 | — | 3 | −0.118 | 2 | j |
| M | 0.01 | 53.2 | 15.4 | 29.7 | — | 1.59 | — | 3.7 | −0.16 | 2 | k |
| N | 0.02 | 65.9 | 15.1 | 17 | 1.44 | 1.42 | 1 | | −0.102 | 1 | l |
| O | 0.014 | 35.8 | 16 | 46.2 | 1.77 | 1.83 | 1 | 4 | −0.054 | 1 | m |
| P | 0.015 | 33.3 | 21.5 | 43.2 | 1.82 | 1.87 | 0 | 3.4 | −0.05 | 2 | n |
| Q | 0.0115 | 34.1 | 19.8 | 44.1 | 1.8 | 1.85 | 1 | 3.8 | −0.063 | 1 | o |
| R | 0.0145 | 33 | 22.3 | 42.8 | 1.83 | 1.88 | 0 | 3.2 | −0.05 | 2 | p | a-5 ply laminate using 0% silica
b-2 ply sat. web - 65% SiO2 - web in
c-2 ply sat. web - 65% SiO2 - web out
d-45% mix - 2 webs out - nonxylene
e-45% mix - 2 webs in - nonxylene
f-45% mix - 3 plys - web out
g-55% mix - 2 webs out - nonxylene
h-55% mix - 2 webs in - nonxylene
i-55% mix - 3 plys - web out
j-35% mix - 2 webs in - silane on Cu
k-35% mix - 2 webs out - silane on Cu
l-20% mix - 4 webs (see 2054–56)
m-Minusil 20 sample - 3 ply, 1080 glass w/Z6040
n-Minsil 20 - 3 ply of 112 A Greige glass
o-Minsil 05 sample - 3 ply, 1080 glass w/Z6040
p-Minsil 05 - 3 ply of 112 A Greige glass Referring to Table 4 and FIGS. 2 and 3, the results of Example 5 indicate first that 40% by volume (of the total laminate) silica is required in order to make the prepreg adequately tack-free to be handled. Secondly, a woven fiberglass volume of greater than 15% is required to produce a non-brittle laminate. Thirdly, the maximum volume of filler and fiberglass is 70%. And fourthly, flatness can be achieved with any filler content but the acceptable range of fiberglass contents increases with increasing filler content.

The foregoing examples further demonstrate that a woven web impregnated with a polybutadiene- or polyisoprene-based resin system which is laminated on one or both sides to conductive sheets and subjected to a high temperature cure cycle will produce a low cost electrical substrate material exhibiting both excellent electrical and mechanical properties. FIG. 4 shows a further embodiment of the present invention wherein the polybutadiene or polyisoprene described in the foregoing examples covers the active element portion 20 of an electrical resistance heating element.

Example 6

Formulations suitable for use as encapsulants for heating elements were prepared using the following components:

TABLE 5

| Trade Name | Source | Description |
|---|---|---|
| Nisso B-3000 | Nippon Soda Company | Low molecular weight polybutadiene resin with a high degree of pendant vinyl functionality |
| Finaprene 401 | Fina Oil and Chemical | SBS copolymer elastomer |
| Sartomer 350 | Sartomer Co. | Trimethylolpropane-trimethacrylate |
| A-172 | OSI Specialties, Inc. | Vinyl tris(2-methoxyethoxy)silane |
| Trigonox C | Akzo Nobel Chemicals | t-butylperbenzoate |
| Percadox BC | Akzo Nobel Chemicals | Dicumyl peroxide |
| Lupersol 101 | Elf Atochem | 2,5-dimethyl-2,5-di(t-butylperoxy)hexane |
| CAO-3 | PMC Specialties | 2,6-di-t-butyl-4-methylphenol ("butylated hydroxytoluene") |

TABLE 5-continued

| Trade Name | Source | Description |
|---|---|---|
| Zinc Stearate | Mallinkrodt Chemical Co. | Zinc stearate |
| 408A-14C-4mm | Owens Corning Fiberglass | E-glass chopped strand |
| Min-Sil 20 | Minco, Inc. | Fused silica |
| Novacite 325 | Malvern Minerals Co. | Natural crystalline silica |
| Saytex BT-93W | Albermarle Corp. | Ethylene bis(tetrabromophthalimide) |
| Antimony Oxide KR | Amspec Specialty | Antimony trioxide |
| Mogul L | Cabot Corp. | Carbon black |

The moldable compositions were prepared by premixing the components with a double planetary mixer. the planetary mixer was equipped with a jacket mixing bowl which allowed heat to be used to increase the fluidity of the resins to ensure their homogeneous dispersion. The temperature of the mixing bowl was regulated to avoid the activation of the peroxides. The premixed components were then further compounded using a conventional, differential speed, 2-roll mill. The compounded material was stripped from the roll mill in the form of a sheet, allowed to cool to room temperature. The sheets were subsequently comminuted to produce a free-flowing granular material.

The granular material molded easily using compression molding. The molded pieces were post cured using a cycle including a linear heating ramp of 1 hour from room temperature to 150° C., followed by a one-hour soak at 150° C., than a 6-hour ramp to 240° C., followed by a 3-hour soak at 240° C., and had the properties shown.

TABLE 6

| Component | Sample Number | | | | | |
|---|---|---|---|---|---|---|
| | 1 | 2 | 3 | 4 | 5 | 6 |
| Nisso B-3000 | 8.79 | 8.60 | 9.61 | 9.26 | 9.28 | 9.28 |
| Finaprene 401 | 3.67 | 3.68 | 5.18 | 1.63 | 1.64 | 1.64 |
| Sartomer SR-350 | 0.48 | 0.49 | 0.59 | 0.44 | 0.22 | 0.44 |
| A-172 Silane | 0.48 | 0.49 | 0.59 | 0.65 | 0.66 | 0.66 |
| Trigonox C | 0.12 | 0.12 | 0.15 | 0.15 | 0.15 | 0.15 |
| Percadox BC | 1.20 | 1.23 | 1.48 | 0.73 | 0.73 | 0.73 |
| Lupersol 101 | 0.00 | 0.00 | 0.00 | 0.73 | 0.73 | 0.73 |
| CAO-3 (BHT) | 0.020 | 0.020 | 0.020 | 0.016 | 0.016 | 0.016 |
| Zinc Stearate | 0.86 | 0.86 | 1.04 | 0.76 | 0.76 | 0.76 |
| 408A-14C | 28.75 | 35.01 | 34.75 | 9.81 | 9.83 | 14.74 |
| Magnesium Hydroxide | 0.00 | 0.00 | 0.00 | 0.00 | 0.00 | 0.00 |
| Min-Sil 20 | 51.12 | 44.96 | 40.07 | 0.00 | 0.00 | 0.00 |
| Novacite 325 | 0.00 | 0.00 | 0.00 | 71.74 | 71.90 | 66.78 |
| Saytex BT-93W | 3.18 | 3.19 | 4.68 | 2.83 | 2.84 | 2.84 |
| Antimony Ox. KR | 1.05 | 1.05 | 1.55 | 10.94 | 0.95 | 0.95 |
| Mogul L | 0.30 | 0.30 | 0.30 | 0.31 | 0.31 | 0.31 |
| Property, Units (Test Method) | | | | | | |
| Unmolded density, g/cm$^3$ (ASTM D792A) (ISO 1183) | 1.71 | 1.81 | 1.69 | 1.91 | 1.83 | 1.88 |
| Spiral flow, inches | 19.5 | 23 | 28 | 29 | 32.5 | 43 |
| Orifice Flow, % | | | | | | |
| 600 psi | — | — | 68 | 77 | 82 | 39 |
| 900 psi | 29 | 31 | 83 | — | — | — |
| 1800 psi | 79 | 86 | — | — | — | — |
| Specific Gravity, g/cm$^3$ (ISO 1183) | | | | | | |
| As-molded | — | — | — | 2.13 | 2.13 | 2.13 |
| Post-cured | 1.95 | 1.97 | 1.89 | 2.12 | 2.13 | 2.13 |
| Molding Shrinkage, % (ASTM D955) | 0.40 | 0.40 | 0.41 | 0.48 | 0.75 | 0.96 |
| Compressive Strength, Mpa (ISO 604) | 223 | 234 | 222 | 293 | 274 | 285 |
| Flexural Strength, Mpa (ISO 178) | 109 | 105 | 117 | 89 | 83 | 86 |
| Flexural Modulus, Gpa (ISO 178) | 20.8 | 19.1 | 17.0 | 15.9 | 15.2 | 15.2 |
| Tensile Strength, Mpa (ISO 527) | 82 | 81 | 80 | 52 | 61 | 55 |
| Flammability Rating (UL 94) | 94V-0 | 94V-0 | 94V-1 | 94V-0 | 94V-0 | 94V-0 |
| Thermal Conductivity, W/m °K. (ASTM E1461) | 0.76 | 0.71 | 0.57 | 1.57 | 0 147 | 0 1.53 |
| Dielectric Strength, Volts/mil (ASTM D149) | 407 | 426 | 416 | 442 | 413 | 424 |
| Arc Resistance, seconds (ASTM D495) | 240 | 197 | 185 | 242 | 242 | 242 |

When used as encapsulants, the compositions have at least a 94 V-0 rating, with a 94 V-5 flame retardance rating preferred. Thermal conductivities (W/m°K) are preferably at least about 0.5, and preferably at least as high as about 1.5. While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical resistance heating element for use in connection with heating a fluid medium, comprising:
   (a) an element body having a supporting surface thereon;
   (b) a resistance wire wound onto the supporting surface and connected to at least a pair of terminal end portions of the element; and
   (c) a thermally conductive polymeric coating disposed over the resistance wire and the supporting surface for hermetically encapsulating and electrically insulating the resistance wire from the fluid, wherein the polymeric coating is formed by subjecting a thermosetting composition comprising a polybutadiene or polyisoprene resin and based on the total composition, from about 5 to about 80% by weight of a high thermal conductivity filler to a high temperature cure at a temperature greater than about 250° C. and less than the decomposition temperature of the composition.

2. The electrical resistance heating element of claim 1, wherein the polybutadiene or polyisoprene resin is liquid at room temperature.

3. The electrical resistance heating element of claim 1, wherein the thermosetting composition further comprises an unsaturated polymer capable of participating in cross-linking with the polybutadiene or polyisoprene resin during cure.

4. The electrical resistance heating element of claim 3, wherein the unsaturated polymer is an unsaturated polybutadiene or polyisoprene containing polymer.

5. The electrical resistance heating element of claim 4, wherein the unsaturated polymer is a copolymer of isoprene or butadiene and a second monomer.

6. The electrical resistance heating element of claim 5, wherein the second monomer is styrene or alpha-methyl styrene.

7. The electrical resistance heating element of claim 5, wherein the unsaturated polymer is a styrene-butadiene-styrene triblock copolymer.

8. The electrical resistance heating element of claim 3, wherein the unsaturated polymer comprises a styrene-butadiene-styrene triblock copolymer or a styrene-(ethylene-propylene)-styrene triblock copolymer.

9. The electrical resistance heating element of claim 1, wherein the high thermal conductivity filler is selected from the group consisting of crystalline silica, fused silica, magnesium oxide, aluminum oxide, titanium dioxide, silicone carbide, boron nitride, and combinations thereof.

10. The electrical resistance heating element of claim 1, wherein the high thermal conductivity filler is selected from the group consisting of crystalline silica, fused silica, and combinations thereof.

11. A water heater comprising:
   (a) a tank for containing water;
   (b) a heating element attached to a wall of the tank for providing electric resistance heating to a portion of the water in the tank, the heating element comprising:
      a support frame;
      a resistance wire wound onto the support frame and connecting to at least a pair of terminal end portions; and
      a thermally conductive polymeric coating disposed over the resistance wire and a major portion of the support frame for hermetically encapsulating and electrically insulating the resistance wire from the fluid, wherein the polymeric coating is formed by subjecting a thermosetting composition comprising a polybutadiene or polyisoprene resin and based in the total composition, from about 5 to about 80% by weight of a high thermal conductivity filler to a high temperature cure at a temperature greater than about 250° C. and less than the decomposition temperature of the composition.

12. The electrical resistance heating element of claim 11, wherein the polybutadiene or polyisoprene resin is liquid at room temperature.

13. The electrical resistance heating element of claim 11, wherein the thermosetting composition further comprises an unsaturated polymer capable of participating in cross-linking with the polybutadiene or polyisoprene resin during cure.

14. The electrical resistance heating element of claim 13, wherein the unsaturated polymer is an unsaturated polybutadiene or polyisoprene containing polymer.

15. The electrical resistance heating element of claim 13, wherein the unsaturated polymer is a copolymer of isoprene or butadiene and a second monomer.

16. The electrical resistance heating element of claim 15, wherein the second monomer is styrene or alpha-methyl styrene.

17. The electrical resistance heating element of claim 16, wherein the unsaturated polymer is a styrene-butadiene-styrene triblock copolymer.

18. The electrical resistance heating element of claim 13, wherein the unsaturated polymer comprises a styrene-butadiene-styrene triblock copolymer or a styrene-(ethylene-propylene)-styrene triblock copolymer.

19. The electrical resistance heating element of claim 11, wherein the high thermal conductivity filler is selected from the group consisting of crystalline silica, fused silica, magnesium oxide, aluminum oxide, titanium dioxide, silicone carbide, boron nitride, and combinations thereof.

20. The electrical resistance heating element of claim 11, wherein the high thermal conductivity filler is selected from the group consisting of crystalline silica, fused silica, and combinations thereof.

21. The electrical resistance heating element of claim 13, wherein the unsaturated polymer is a copolymer of isoprene or butadiene and a second monomer.

22. The electrical resistance heating element of claim 21, wherein the polybutadiene or polyisoprene resin is liquid at room temperature.

23. The electrical resistance heating element of claim 21, wherein the thermosetting composition further comprises an unsaturated polymer capable of participating in cross-linking with the polybutadiene or polyisoprene resin during cure.

24. The electrical resistance heating element of claim 23, wherein the unsaturated polymer is an unsaturated polybutadiene or polyisoprene containing polymer.

25. The electrical resistance heating element of claim 23, wherein the unsaturated polymer is a copolymer of isoprene or butadiene and a second monomer.

26. The electrical resistance heating element of claim 25, wherein the second monomer is styrene or alpha-methyl styrene.

27. The electrical resistance heating element of claim 26, wherein the unsaturated polymer is a styrene-butadiene-styrene triblock copolymer.

28. The electrical resistance heating element of claim 23, wherein the unsaturated polymer comprises a styrene-butadiene-styrene triblock copolymer or a styrene-(ethylene-propylene)-styrene triblock copolymer.

29. The electrical resistance heating element of claim 21, wherein the high thermal conductivity filler is selected from the group consisting of crystalline silica, fused silica, magnesium oxide, aluminum oxide, titanium dioxide, silicone carbide, boron nitride, and combinations thereof.

30. The electrical resistance heating element of claim 21, wherein the high thermal conductivity filler is selected from the group consisting of crystalline silica, fused silica, and combinations thereof.

31. An electrical resistance heating element capable of being disposed through a wall of a tank for use in connection with heating a fluid medium, comprising:
   (a) a polymeric support frame;
   (b) a resistance heating wire having a pair of free ends joined to a pair of terminal end portions, the resistance heating wire wound onto and supported by the support frame; and
   (c) a non-electrically conductive, polymeric coating containing an electrically insulating, thermally conductive ceramic additive for improving the thermal conductivity of the coating, the coating disposed over the resistance wire and a portion of the support frame for hermetically encapsulating and electrically insulating the resistance wire from the fluid, wherein the polymeric coating is formed by subjecting a thermosetting composition comprising a polybutadiene or polyisoprene resin and based in the total composition, from about 5 to about 80% by weight of a high thermal conductivity filler to a high temperature cure at a temperature greater than about 250° C. and less than the decomposition temperature of the composition.

32. The electrical resistance heating element of claim 31, wherein the polybutadiene or polyisoprene resin is liquid at room temperature.

33. The electrical resistance heating element of claim 31, wherein the thermosetting composition further comprises an unsaturated polymer capable of participating in cross-linking with the polybutadiene or polyisoprene resin during cure.

34. The electrical resistance heating element of claim 33, wherein the unsaturated polymer is an unsaturated polybutadiene or polyisoprene containing polymer.

35. The electrical resistance heating element of claim 33, wherein the unsaturated polymer is a copolymer of isoprene or butadiene and a second monomer.

36. The electrical resistance heating element of claim 35, wherein the second monomer is styrene or alpha-methyl styrene.

37. The electrical resistance heating element of claim 36, wherein the unsaturated polymer is a styrene-butadiene-styrene triblock copolymer.

38. The electrical resistance heating element of claim 33, wherein the unsaturated polymer comprises a styrene-butadiene-styrene triblock copolymer or a styrene-(ethylene-propylene)-styrene triblock copolymer.

39. The electrical resistance heating element of claim 31, wherein the high thermal conductivity filler is selected from the group consisting of crystalline silica, fused silica, magnesium oxide, aluminum oxide, titanium dioxide, silicone carbide, boron nitride, and combinations thereof.

40. The electrical resistance heating element of claim 31, wherein the high thermal conductivity filler is selected from the group consisting of crystalline silica, fused silica, and combinations thereof.

41. An electrical resistance heating element for use in connection with heating a fluid medium, comprising:
   (a) an element body having a supporting surface thereon;
   (b) a resistance wire wound onto the supporting surface and connected to at least a pair of terminal end portions of the element; and
   (c) a thermally-conductive, non-electrically conductive, polymeric coating disposed over the resistance wire and a substantial portion of the supporting surface for hermetically encapsulating and electrically insulating the resistance wire from the fluid, wherein the polymeric coating is formed by subjecting a thermosetting composition comprising a polybutadiene or polyisoprene resin and based in the total composition, from about 5 to about 80% by weight of a high thermal conductivity filler to a high temperature cure at a temperature greater than about 250° C. and less than the decomposition temperature of the composition.

42. The electrical resistance heating element of claim 41, wherein the polybutadiene or polyisoprene resin is liquid at room temperature.

43. The electrical resistance heating element of claim 41, wherein the thermosetting composition further comprises an unsaturated polymer capable of participating in cross-linking with the polybutadiene or polyisoprene resin during cure.

44. The electrical resistance heating element of claim 43, wherein the unsaturated polymer is an unsaturated polybutadiene or polyisoprene containing polymer.

45. The electrical resistance heating element of claim 43, wherein the unsaturated polymer a copolymer of isoprene or butadiene and a second monomer.

46. The electrical resistance heating element of claim 45, wherein the second monomer is styrene or alpha-methyl styrene.

47. The electrical resistance heating element of claim 46, wherein the unsaturated polymer is a styrene-butadiene-styrene triblock copolymer.

48. The electrical resistance heating element of claim 43, wherein the unsaturated polymer comprises a styrene-butadiene-styrene triblock copolymer or a styrene-(ethylene-propylene)-styrene triblock copolymer.

49. The electrical resistance heating element of claim 41, wherein the high thermal conductivity filler is selected from the group consisting of crystalline silica, fused silica, magnesium oxide, aluminum oxide, titanium dioxide, silicone carbide, boron nitride, and combinations thereof.

50. The electrical resistance heating element of claim 41, wherein the high thermal conductivity filler is selected from the group consisting of crystalline silica, fused silica, and combinations thereof.

51. The electric resistance heating of claim 41, further comprising a ceramic material surrounding and electrically insulating the wire and a metal sheath encasing the ceramic material and electrical resistance wire, wherein the thermally conductive polymeric coating is disposed over the metal sheath for hermetically encapsulating and electrically insulating the metal sheath from the fluid.

52. An electric resistance heating element for use in connection with heating a fluid medium, comprising:
   (a) an electrical resistance wire;
   (b) a ceramic material surrounding and electrically insulating the wire;
   (c) a metal sheath encasing the ceramic material and electrical resistance wire; and
   (d) a thermally conductive polymeric coating disposed over the metal sheath for hermetically encapsulating and electrically insulating the metal sheath from the fluid, wherein the polymeric coating is formed by subjecting a thermosetting composition comprising a polybutadiene or polyisoprene resin and based in the total composition, from about 5 to about 80% by weight of a high thermal conductivity filler to a high temperature cure at a temperature greater than about 250° C. and less than the decomposition temperature of the composition.

53. The electrical resistance heating element of claim 52, wherein the polybutadiene or polyisoprene resin is liquid at room temperature.

54. The electrical resistance heating element of claim 52, wherein the thermosetting composition further comprises an unsaturated polymer capable of participating in cross-linking with the polybutadiene or polyisoprene resin during cure.

55. The electrical resistance heating element of claim 54, wherein the unsaturated polymer is an unsaturated polybutadiene or polyisoprene containing polymer.

56. The electrical resistance heating element of claim 54, wherein the unsaturated polymer is a copolymer of isoprene or butadiene and a second monomer.

57. The electrical resistance heating element of claim 56, wherein the second monomer is styrene or alpha-methyl styrene.

58. The electrical resistance heating element of claim 57, wherein the unsaturated polymer is a styrene-butadiene-styrene triblock copolymer.

59. The electrical resistance heating element of claim 54, wherein the unsaturated polymer comprises a styrene-butadiene-styrene triblock copolymer or a styrene-(ethylene-propylene)-styrene triblock copolymer.

60. The electrical resistance heating element of claim 52, wherein the high thermal conductivity filler is selected from the group consisting of crystalline silica, fused silica, magnesium oxide, aluminum oxide, titanium dioxide, silicone carbide, boron nitride, and combinations thereof.

61. The electrical resistance heating element of claim 52, wherein the high thermal conductivity filler is selected from the group consisting of crystalline silica, fused silica, and combinations thereof.

62. An electrical resistance heating element for use in connection with heating a fluid medium, comprising:
  (a) an element body having a supporting surface thereon;
  (b) a resistance wire wound onto the supporting surface and connected to at least a pair of terminal end portions of the element; and
  (c) a thermally conductive polymeric coating disposed over the resistance wire and the supporting surface for hermetically encapsulating and electrically insulating the resistance wire from the fluid, wherein the polymeric coating comprises a cured polybutadiene or polyisoprene resin and based on the total composition, from about 5 to about 80% by weight of a high thermal conductivity filler.

63. The electrical resistance heating element of claim 62, wherein the high thermal conductivity filler is selected from the group consisting of crystalline silica, fused silica, magnesium oxide, aluminum oxide, titanium dioxide, silicone carbide, boron nitride, and combinations thereof.

64. The electrical resistance heating element of claim 62, wherein the high thermal conductivity filler is selected from the group consisting of crystalline silica, fused silica, and combinations thereof.

65. A water heater comprising:
  (a) a tank for containing water;
  (b) a heating element attached to a wall of the tank for providing electric resistance heating to a portion of the water in the tank, the heating element comprising:
    a support frame;
    a resistance wire wound onto the support frame and connecting to at least a pair of terminal end portions; and
    a thermally conductive polymeric coating disposed over the resistance wire and a major portion of the support frame for hermetically encapsulating and electrically insulating the resistance wire from the fluid, wherein the polymeric coating comprises a cured polybutadiene or polyisoprene resin and based on the total composition, from about 5 to about 80% by weight of a high thermal conductivity filler.

66. The electrical resistance heating element of claim 65, wherein the high thermal conductivity filler is selected from the group consisting of crystalline silica, fused silica, magnesium oxide, aluminum oxide, titanium dioxide, silicone carbide, boron nitride, and combinations thereof.

67. The electrical resistance heating element of claim 65, wherein the high thermal conductivity filler is selected from the group consisting of crystalline silica, fused silica, and combinations thereof.

68. An electrical resistance heating element capable of being disposed through a wall of a tank for use in connection with heating a fluid medium, comprising:
  (a) a polymeric support frame;
  (b) a resistance heating wire having a pair of free ends joined to a pair of terminal end portions, the resistance heating wire wound onto and supported by the support frame; and
  (c) a non-electrically conductive, polymeric coating containing an electrically insulating, thermally conductive ceramic additive for improving the thermal conductivity of the coating, the coating disposed over the resistance wire and a portion of the support frame for hermetically encapsulating and electrically insulating the resistance wire from the fluid, wherein the polymeric coating comprises a cured polybutadiene or polyisoprene resin and bases on the total composition, from about 5 to about 80% by weight of a high thermal conductivity filler.

69. The electrical resistance heating element of claim 68, wherein the high thermal conductivity filler is selected from the group consisting of crystalline silica, fused silica, magnesium oxide, aluminum oxide, titanium dioxide, silicone carbide, boron nitride, and combinations thereof.

70. The electrical resistance heating element of claim 69, wherein the high thermal conductivity filler is selected from the group consisting of crystalline silica, fused silica, and combinations thereof.

71. An electrical resistance heating element for use in connection with heating a fluid medium, comprising:
  (a) an element body having a supporting surface thereon;
  (b) a resistance wire wound onto the supporting surface and connected to at least a pair of terminal end portions of the element; and
  (c) a thermally-conductive, non-electrically conductive, polymeric coating disposed over the resistance wire and a substantial portion of the supporting surface for hermetically encapsulating and electrically insulating the resistance wire from the fluid, wherein the polymeric coating comprises a cured polybutadiene or polyisoprene resin and based on the total composition, form about 5 to about 80% by weight of a high thermal conductivity filler.

72. The electrical resistance heating element of claim 71, wherein the high thermal conductivity filler is selected from the group consisting of crystalline silica, fused silica, magnesium oxide, aluminum oxide, titanium dioxide, silicone carbide, boron nitride, and combinations thereof.

73. The electrical resistance heating element of claim 72, wherein the high thermal conductivity filler is selected from the group consisting of crystalline silica, fused silica, and combinations thereof.

74. The electric resistance heating of claim 71, further comprising a ceramic material surrounding and electrically insulating the wire and a metal sheath encasing the ceramic material and electrical resistance wire, wherein the thermally conductive polymeric coating is disposed over the metal sheath for hermetically encapsulating and electrically insulating the metal sheath from the fluid.

75. An electric resistance heating element for use in connection with heating a fluid medium, comprising:

(a) an electrical resistance wire;
(b) a ceramic material surrounding and electrically insulating the wire;
(c) a metal sheath encasing the ceramic material and electrical resistance wire; and
(d) a thermally conductive polymeric coating disposed over the metal sheath for hermetically encapsulating and electrically insulating the metal sheath from the fluid, wherein the polymeric coating comprises a cured polybutadiene or polyisoprene resin based on the total composition, from about 5 to about 80% by weight of a high thermal conductivity filler.

76. The electrical resistance heating element of claim 75, wherein the high thermal conductivity filler is selected from the group consisting of crystalline silica, fused silica, magnesium oxide, aluminum oxide, titanium dioxide, silicone carbide, boron nitride, and combinations thereof.

77. The electrical resistance heating element of claim 76, wherein the high thermal conductivity filler is selected from the group consisting of crystalline silica, fused silica, and combinations thereof.

* * * * *